(12) United States Patent
Kolnik

(10) Patent No.: US 10,846,451 B1
(45) Date of Patent: Nov. 24, 2020

(54) METHODS OF MODELLING IRREGULAR SHAPED TRANSISTOR DEVICES IN CIRCUIT SIMULATION

(71) Applicant: Cobham Colorado Springs Inc., Colorado Springs, CO (US)

(72) Inventor: Jan Kolnik, Colorado Springs, CO (US)

(73) Assignee: Cobham Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 16/509,171

(22) Filed: Jul. 11, 2019

(51) Int. Cl.
    *G06F 17/50*      (2006.01)
    *G06F 30/367*      (2020.01)
    *G06F 30/398*      (2020.01)

(52) U.S. Cl.
    CPC .......... *G06F 30/367* (2020.01); *G06F 30/398* (2020.01)

(58) Field of Classification Search
    CPC ...... G06F 30/367; G06F 30/398; G06F 30/20; G06F 30/10; G06F 30/3308; G06F 30/373
See application file for complete search history.

(56) References Cited

U.S. PATENT DOCUMENTS

| | | | | |
|---|---|---|---|---|
| 7,730,432 B1 * | 6/2010 | Gupta | ..................... | G06F 30/39 716/135 |
| 2006/0150132 A1 * | 7/2006 | Gupta | ................. | G03F 7/70433 716/51 |
| 2007/0078638 A1 * | 4/2007 | McDonald | ............ | G06F 30/367 703/14 |

* cited by examiner

*Primary Examiner* — Nghia M Doan
(74) *Attorney, Agent, or Firm* — Morgan, Lewis & Bockius LLP

(57) ABSTRACT

This application is directed to methods and systems of verifying integrated circuit including an irregular shaped transistor device. The irregular shaped transistor device has a gate, a source, a drain, and a first channel connecting the source and drain and having an irregular shape. An equivalent resistance of the first channel is determined based on the irregular shape of the first channel. A length of the first channel is determined optionally based on locations of the source and drain. An equivalent width of the first channel of the irregular shaped transistor device is determined based on the equivalent resistance and length of the first channel, thereby enabling representation of the irregular shaped transistor device, by a regular shaped transistor device having a second channel, in analysis of the integrated circuit. The second channel optionally has a rectangular shape measured by the equivalent width and the length of the first channel.

20 Claims, 13 Drawing Sheets

1100

| Shape | Source Size – Width (by unit contacts) | Source Size - Length (by unit contacts) | Channel Length (μm) | Equivalent Resistance (ohm) |
|---|---|---|---|---|
| Hollow Octagon | 1 | 2 | 3 | $R_0$ |
| Hollow Octagon | 1 | 3 | 3 | $0.85R_0$ |
| Hollow Octagon | 2 | 2 | 3 | $0.9R_0$ |
| Hollow Octagon | 1 | 2 | 6 | $1.95R_0$ |
| Hollow Octagon | 1 | 2 | 9 | $2.9R_0$ |

Interpolation:

| Hollow Octagon | 1 | 2 | 8 | ~ $2.58R0$ |
|---|---|---|---|---|

Figure 11B

METHODS OF MODELLING IRREGULAR SHAPED TRANSISTOR DEVICES IN CIRCUIT SIMULATION

TECHNICAL FIELD

The disclosed embodiments relate generally to electronic design automation. In particular, the disclosed embodiments relate to a method, a computer system and a non-transitory storage medium for representing irregular shaped transistor devices with regular shaped transistor devices to facilitate simulation of an integrated circuit during the design thereof.

BACKGROUND

Many of today's electronic systems, such as desktop computers and servers, include processors and memory made of integrated circuits. In designing integrated circuits, each integrated circuit can include numerous electronic devices (e.g., transistor devices, resistors, capacitors). Operation of the integrated circuit must be verified via electronic design automation (EDA) before being physically manufactured. For example, SPICE ("Simulation Program with Integrated Circuit Emphasis") is a general-purpose, open-source analog electronic circuit simulator that is commonly used in EDA for circuit verification. In SPICE, a transistor device is normally modelled as a regular shaped device having a rectangular channel. Such a regular shaped device is not optimized for real estate in a hose device, or device performance as required in some critical electronic systems. Such regular shaped devices may occupy a relatively large chip area and be inefficient in terms of usage of the chip area, or may be susceptible to electromagnetic radiation compared with some irregular shaped devices. As such, it is desirable to provide a method and system that can simulate an integrated circuit having irregular shaped devices accurately and smoothly, thereby allowing for irregular shaped transistor devices that enhance real estate usage and performance of integrated circuit used in such electronic systems.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to modelling an irregular shaped transistor device in simulation of integrated circuit during a design phase.

In accordance with one aspect of the application, there is provided a circuit simulation method that is implemented at a computer system including one or more processors and memory. The circuit simulation method includes identifying an irregular shaped transistor device in an integrated circuit (e.g., in a circuit schematic or layout). The irregular shaped transistor device has a gate, a source, a drain, and a first channel that connects the source and drain and has an irregular shape. The circuit simulation method further includes determining an equivalent resistance of the first channel of the irregular shaped transistor device based on the irregular shape of the first channel and determining a length of the first channel (e.g., based on locations of the source and drain). The circuit simulation method further includes determining an equivalent width of the first channel of the irregular shaped transistor device based on the equivalent resistance of the first channel and the length of the first channel, thereby enabling representation of the irregular shaped transistor device, by a regular shaped transistor device having a second channel, in subsequent analysis of the integrated circuit. The second channel optionally has a rectangular shape measured by the equivalent width and the length of the first channel of the irregular shaped transistor device. In some embodiments, one or more electrical characteristics of the integrated circuit are determined based on analysis that replaces the irregular shaped transistor device with the regular shaped transistor device in the integrated circuit.

According to another aspect, there is provided a computer system that includes one or more processors and memory storing one or more programs for execution by the processors. The one or more programs stored in the memory includes instructions for implementing the above described circuit simulation method.

According to another aspect, there is provided a non-transitory computer readable storage medium storing one or more programs configured for execution by one or more processors of a computer system. The one or more programs stored in the non-transitory computer readable storage medium includes instructions for implementing the above described circuit simulation method.

The methods, systems, and non-transitory computer readable storage media herein address existing problems of simulating irregular shaped transistor devices in integrated circuit during a design phase, such that the irregular shaped transistor devices can be applied in place of regular shaped transistor devices to enhance usage of chip area and/or circuit performance (e.g., immunity to radiation) of the integrated circuit.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 11A illustrates an example equivalent resistance model for irregular shaped transistor devices, and FIG. 11 B illustrates characteristics of an irregular shape transistor device that is not included in the lookup table shown in FIG. 11A in accordance with some embodiments.

Figure 1:
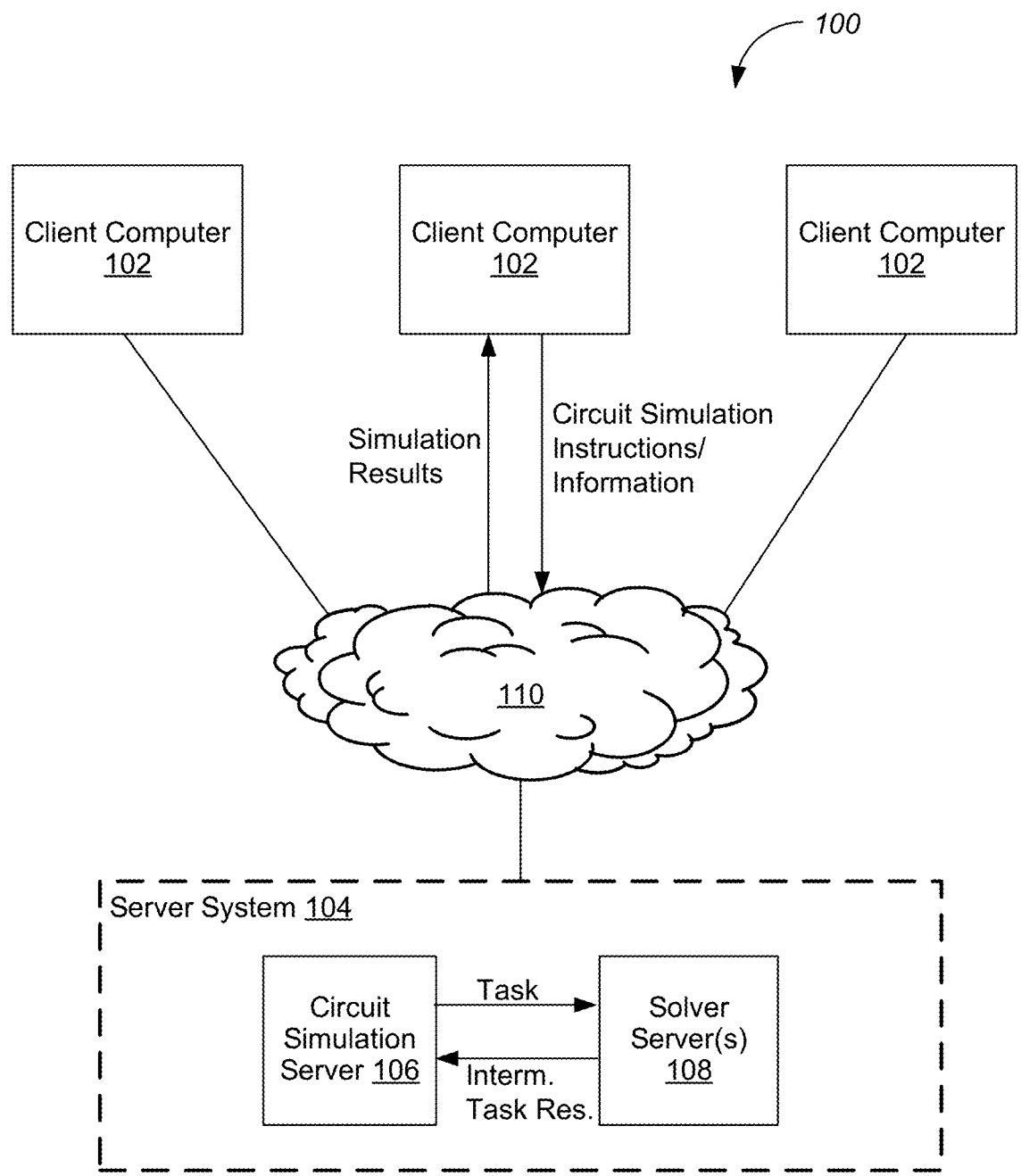
FIG. 1 illustrates a representative electronic design automation environment in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include computer systems, methods and/or non-transitory computer readable storage media for implementing electronic design automation. In particular, when an irregular shaped transistor device is applied in integrated circuit, the irregular shaped transistor devices is represented with a regular shaped transistor device during a design phase based on an equivalent resistance and an equivalent width the irregular shaped transistor device. By these means, operation of the irregular shaped transistor device can be properly verified using the regular shaped transistor device prior to being manufactured in the integrated circuit.

For example, an annular transistor device is used in integrated circuit for the purposes of having a compact form factor and/or suppressing its susceptibility to electromagnetic radiation. The annular transistor device has a channel of an annular shape. However, some circuit simulation tools (e.g., SPICE programs) only recognize and analyze rectangular shaped channels. The annular transistor device is thereby converted to a rectangular transistor device, so that these circuit simulation tools can be applied to simulate and verify performance of the annular transistor device. Specifically, physical characteristics (e.g., channel dimensions) of the annular transistor device are extracted and exported to an electromagnetic field solver program (e.g., a high-frequency structure simulator (HFSS) program). The electromagnetic field solver program is distinct from the circuit simulation tools and is involved in determining an equivalent resistance of the annular transistor device from which an equivalent width is derived. The circuit simulation tools then represent the annular transistor device with a rectangular transistor device having a width equal to the equivalent width during design simulation and verification.

That said, according to some embodiments, there is provided a circuit simulation method that is implemented at a computer system including one or more processors and memory. The circuit simulation method includes identifying an irregular shaped transistor device in an integrated circuit. The irregular shaped transistor device has a gate, a source, a drain and a first channel that connects the source and drain. The first channel has an irregular shape. The circuit simulation method further includes determining an equivalent resistance of the first channel of the irregular shaped transistor device based on the irregular shape of the first channel and determining a length of the first channel (e.g., based on locations of the source and drain). The circuit simulation method further includes determining an equivalent width of the first channel of the irregular shaped transistor device based on the equivalent resistance of the first channel and the length of the first channel, thereby enabling representation of the irregular shaped transistor device, by a regular shaped transistor device having a second channel, in subsequent analysis of the integrated circuit. In some embodiments, one or more electrical characteristics (e.g., those related to specific functions, power and speed) of the integrated circuit are determined based on analysis that replaces the irregular shaped transistor device with the regular shaped transistor device in the integrated circuit.

In some embodiments, the equivalent resistance of the first channel of the irregular shaped transistor device is determined by a solver program. The solver program is executed at the computer system, and used to determine the equivalent resistance of the first channel of the irregular shaped transistor device based on a small signal excitation model. In an example, the solver program includes a field solver program configured to determine the equivalent resistance of the first channel based on analysis of electrical field in the first channel. One or both of a first terminal associated with the source and a second terminal associated with the drain are identified. S-parameters of the first channel of the irregular shaped transistor device are determined in response to a small excitation signal at the first terminal associated with the source. The S-parameters to Z-parameters of the first channel of the irregular shaped transistor device, and the equivalent resistance of the first channel is determined based on the Z-parameters of the first channel. In another example, the solver program includes a device solver program configured to determine the equivalent resistance of the first channel based on current-voltage behavior of the irregular shaped transistor device. A first terminal is identified in association with the source of the irregular shaped transistor. One or more current-voltage curves of the first channel of the irregular shaped transistor device are determined in response to a DC voltage applied at the first terminal associated with the source. The equivalent resistance of the first channel is determined based on the one or more current-voltage curves of the first channel.

In some embodiments, a predetermined equivalent resistance model (e.g., a lookup table, a formula) is determined based on the irregular shape. A set of device characteristics is determined. In accordance with the predetermined equivalent resistance model, the computer system determines the equivalent resistance of the first channel of the irregular shaped transistor device based on the set of device characteristics. Further, in some embodiments, the predetermined equivalent resistance model is established using a solver program (e.g., a field solver program, a device solver program) and stored in the memory of the computer system. In some embodiments, the predetermined equivalent resistance model includes a lookup table or a formula. The lookup table or formula associates each of one or more combinations of values of the set of device characteristics with a respective equivalent resistance of the first channel. Further, in some embodiments, the equivalent resistance of the first channel of the irregular shaped transistor device is interpolated from two equivalent resistances in the lookup table.

Specifically, in an example, the predetermined equivalent resistance model is determined based on a small signal excitation model in the field solver program. A plurality of device characteristics are determined for the irregular shaped transistor device. For each of one or more combinations of values of the plurality of device characteristics, one or both of a first terminal associated with the source and a second terminal associated with the drain are identified, and S-parameters of the first channel of the irregular shaped transistor device are determined in response to a small excitation signal inputted at the first terminal associated with the source. The S-parameters are converted to Z-parameters of the first channel of the irregular shaped transistor device. A respective equivalent resistance of the first channel is determined based on the Z-parameters of the first channel for each combination of device characteristics. The respective combination of values of the plurality of device characteristics is associated with the respective equivalent resistance of the first channel in a lookup table.

In another example, the lookup table or the formula of the predetermined equivalent resistance model is determined in the device solver program. A plurality of device characteristics are determined for the irregular shaped transistor device. For each of one or more combinations of values of the plurality of device characteristics, one or both of a first terminal associated with the source and a second terminal associated with the drain are identified. The device solver program optionally includes a device simulation tool configured to determine DC electrical properties. Current-voltage curves of the first channel are determined in response to a DC voltage applied to the first or second terminal. A respective equivalent resistance of the first channel is determined based on the current-voltage curves of the first channel for each combination of device characteristics. The respective combination of values of the plurality of device characteristics is associated with the respective equivalent resistance of the first channel in the lookup table or the formula.

In some embodiments, the length of the first channel is determined by at least averaging a distance between the source and drain along a width of the first channel of the irregular shaped transistor device. Alternatively, in some embodiments, the length of the first channel is determined by identifying a minimum length and a maximum length along a width of the first channel of the irregular shaped transistor device and averaging the minimum length and the maximum length. Alternatively, in some embodiments, the length of the first channel is determined by identifying a middle point along a width of the first channel of the irregular shaped transistor device and determining a channel length at the middle point to represent the length of the first channel.

In some embodiments, the second channel has a rectangular shape measured by the equivalent width and the length of the first channel of the irregular shaped transistor device. The irregular shape is defined by an overlapping area of the gate and an active area. One of the source and drain is disposed in a center region of the irregular shape, and the other one of the source and drain is disposed in proximity to a periphery of the irregular shape. Further, in some embodiments, the irregular shape is one of a predefined hollow rectangle, hollow hexagon and hollow octagon. In some embodiments, the irregular shape is one of a hollow circular shape, a serpentine shape and a grid. Specifically, in some embodiments, the gate includes an array of openings, and each opening is configured to accommodate a contact for one of the source and drain.

In some embodiments, the computer system is a local client device installed with one or both of a circuit simulation program and a solver program (e.g., a field solver program, a device solver program) that are configured to implement the circuit simulation method jointly. In some embodiments, the computer system includes a local client device and a server system, and the server system is installed with a circuit simulation program and/or a solver program configured to implement the circuit simulation method.

In some embodiments, a sheet resistance of the first channel of the irregular shaped transistor device is determined. The equivalent width of the first channel of the irregular shaped transistor device is further determined based on the sheet resistance and the length of the first channel.

According to another embodiment, there is provided a computer system that includes one or more processors and memory storing one or more programs for execution by the processors. The one or more programs stored in the memory includes instructions for implementing any of the above described circuit simulation methods.

According to another embodiment, there is provided a non-transitory computer readable storage medium storing one or more programs configured for execution by one or more processors of a computer system. The one or more programs stored in the non-transitory computer readable storage medium includes instructions for implementing any of the above described circuit simulation methods.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 illustrates a representative electronic design automation (EDA) environment 100 in accordance with some embodiments. In the EDA environment 100, a server system 104 is remote from one or more client computer devices 102, and communicatively coupled to the one or more client computer devices 102 via one or more communication network 110. The one or more client computer devices 102 are located optionally at a specific location or at different locations that are remoted from each other. In a specific example, the EDA environment 100 is established for a large engineering company. Engineers are located at different company sites (e.g., across the entire world) and send circuit simulation instructions from their respective client computer devices 102 located at the different company sites. The server system 104 is configured to process the circuit simulation instructions in a centralized manner.

The server system 104 includes one or more of a circuit simulation server 106 configured to execute a circuit simulation program (e.g., a SPICE simulator program, an Advanced Design System (ADS) program) and one or more solver servers 108 each of which is configured to execute a solver program (e.g., an electromagnetic field solver program, a device solver program) The solver program is distinct from the circuit simulation program. The circuit simulation server 106 receives a circuit simulation instruction and information of integrated circuit from a client computer device 102, and simulates the integrated circuit using the circuit simulation program in response to the circuit simulation instruction. The integrated circuit optionally includes an irregular shaped transistor device. During the course of simulating the integrated circuit, the circuit simulation sever 106 generates one or more tasks (e.g., determining an equivalent resistance of a transistor channel having an irregular shape) and assigns each of the one or more tasks to one of the solver servers 108 that runs a respective solver program configured to solve the respective task assigned to the respective solver server 108. The respective solver server 108 completes the assigned task and returns an intermediate task result (e.g., the equivalent resistance) to the circuit simulation server 106, such that the circuit simulation server 106 may continue and complete simulation of the integrated circuit based on the intermediate task result returned by the respective solver server 108. Simulation results are generated and returned to the requesting client computer device 102 via the communication network 110. In some embodiments, the circuit simulation server 106 and a subset (or all) of the one or more solver servers 108 are integrated in a server computer. In some embodiments, the circuit simulation server 106 and a subset (or all) of the one or more solver servers 108 are distinct from each other, but can be located in proximity to each other or remotely from each other.

Circuit simulation is implemented jointly by the server system 104 and the one or more client computer devices 102. Related circuit simulation programs are executed at the server system 104 and client computer devices 102 to implement circuit simulation jointly. Specifically, a local circuit simulation program is executed at a client computer device 102, and a user interface is enabled at the client computer device 102 to obtain information of integrated circuit and receive user inputs of circuit simulation instructions. In some embodiments, the circuit simulation instructions are generated in the local circuit simulation program and sent to the server system 104. A corresponding circuit simulation program is executed at the server system 104, and configured to implement the circuit simulation instructions remotely at the server system 104. Alternatively, in some implementations, the local circuit simulation program is configured to implement a set of local functions, and the circuit simulation instructions are partially executed at the client computer device 102. The partially executed circuit simulation instructions are sent to the server system 104 with intermediate simulation results for further execution. After execution of the instructions are completed at the server system 104, simulation results of the circuit simulation instructions are transferred from the server system 104 to the client computer device 102, and are available to be presented on the user interface according to user review requests. In some implementations, the local circuit simulation program is configured to visualize the simulation results of the circuit simulation instructions on the user interface according to visual effects defined in the user review requests.

In some embodiments, the computer devices 102 may be located at the same physical location or distributed across different geographical areas. A respective client computer device 102 communicates with another computer device 102 or server in the server system 104 using one or more communication networks 110. Likewise, servers in the server system 104 may be located at the same physical location or distributed across different geographical areas. A respective server in the server system 104 communicates with another server in the server system 104 or client computer device 102 using the one or more communication networks 110. The aforementioned communications include communications during normal operations (e.g., user-level operations, such as emailing, Internet browsing, VoIP, database accessing, etc.). The communication network(s) 110 used can be one or more networks having one or more type of topologies, including but not limited to the Internet, intranets, local area networks (LANs), cellular networks, Ethernet, Storage Area Networks (SANs), telephone networks, Bluetooth personal area networks (PAN) and the like. In some embodiments, two or more computer devices 102 in a sub-network are coupled via a wired connection, while some of the computer devices 102 in the same sub-network are optionally coupled via a Bluetooth PAN. Likewise, in some embodiments, two or more servers in the server system 104 in a sub-network are coupled via a wired connection while some servers in the server system 104 in the same sub-network are optionally coupled via a Bluetooth PAN.

Alternatively, in some embodiments not shown in FIG. 1, electronic design automation is implemented entirely locally at a computer machine. A circuit simulation program is installed at the computer machine. During circuit simulation, the computer machine runs the circuit simulation program according to circuit simulation instructions independently without communicating with the server system 104. In some implementations, the computer machine is also installed with a solver program (e.g., a field solver program, a device solver program) configured to complete tasks assigned by the circuit simulation program during the course of processing the circuit simulation instructions. Alternatively, in some implementations, the solver program is not installed locally at the computer machine, and therefore, the computer machine assigns the tasks to the solver program executed remotely at the solver server 108 and receives intermediate task results from the solver program before it completes simulation of corresponding integrated circuit. During the course of simulating the integrated circuit, the computer machine determines an equivalent resistance and a length of a channel of an irregular shaped transistor device and derives an equivalent width of the channel of the irregular shaped transistor device, thereby enabling representation of the irregular shaped transistor device by a regular shaped transistor device in subsequent analysis of the integrated circuit.

Figure 2:
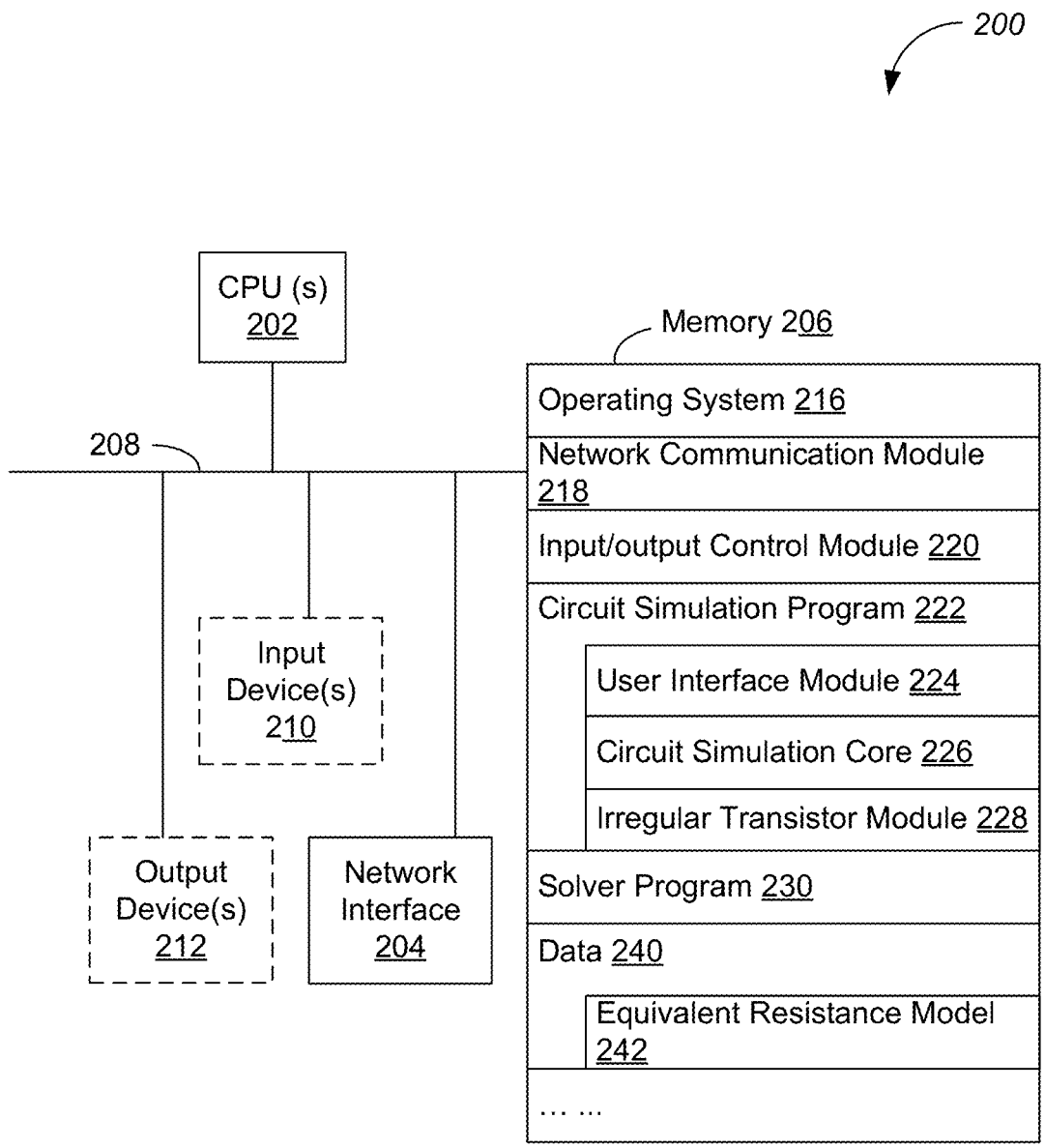
FIG. 2 is a block diagram illustrating a representative computer system in accordance with some embodiments.

FIG. 2 is a block diagram illustrating a representative computer system 200 in accordance with some embodiments. In some implementations, the computer system 200 is a client computer device 102 configured to implement a circuit simulation method for simulating integrated circuit including an irregular shaped transistor device independently and locally. In some implementations, the computer system 200 is a combination of a client computer device 102 and a server system 104, which are configured to implement the circuit simulation method jointly. Specifically, the server system 104 of the computer system 200 is configured to receive circuit simulation instructions from the client computer device 102, implement a circuit simulation method for simulating integrated circuit including an irregular shaped transistor device, and provide simulation results to the client computer device 102.

The computer system 200 typically includes one or more processing units (CPUs) 202, one or more network interfaces 204, memory 206, and one or more communication buses 208 for interconnecting these components (sometimes called a chipset). The computer system 200 includes one or more output devices 212, e.g., one or more speakers, a display and one or more indicators. The computer system 200 also includes one or more input devices 210 (e.g., a keyboard) that facilitate user input. Memory 206 includes high-speed random access memory, such as DRAM, SRAM, DDR RAM, or other random access solid state memory devices; and, optionally, includes non-volatile memory, such as one or more magnetic disk storage devices, one or more optical disk storage devices, one or more flash memory devices, or one or more other non-volatile solid state storage devices. Memory 206, optionally, includes one or more storage devices remotely located from one or more processing units 202. Memory 206, or alternatively the non-volatile memory within memory 206, includes a non-transitory computer readable storage medium. In some implementations, memory 206, or the non-transitory computer readable storage medium of memory 206, stores the following programs, modules, and data structures, or a subset or superset thereof:

- Operating system 216 including procedures for handling various basic system services and for performing hardware dependent tasks;
- Network communication module 218 for connecting the computer system 200 to other devices (e.g., a distinct client computer device 102) and/or connecting a client computer device 102 and a server system 104 in the computer system 200 via one or more network interfaces 204 (wired or wireless) and one or more networks 110, such as the Internet, other wide area networks, local area networks, metropolitan area networks, and so on;
- Input/output control module 220 that includes procedures for handling various basic input and output functions through one or more input and output devices 210 and 212;
- Circuit simulation program 222 for simulating integrated circuit in response to circuit simulation instructions, including one or more of:
    - User interface module 224 configured to enable a user interface for receiving user inputs of circuit simulation instructions and presenting simulation results to a user of a client computer device 102;
    - Circuit simulation core 226 configured to obtain the circuit simulation instructions and corresponding information of integrated circuit, analyze operation of the integrated circuit according to the circuit simulation instructions, and provide the simulation results for presentation to the user by the user interface module; and
    - Irregular transistor device module 228 configured to receive from the circuit simulation core 226 a task of analyzing an irregular shaped transistor device using a solver program 230 distinct from the circuit simulation program application 222, send a request to the solver program 230 to implement the task, receive intermediate task results (e.g., equivalent resistance of a channel of the irregular shaped transistor device) from the solver program 230, and convert the intermediate task results to results that can be used by the circuit simulation core 226 (e.g., an equivalent width of the channel of the irregular shaped transistor device);
- Solver program 230 for completing the task assigned to the solver program 230, including analyzing the irregular shaped transistor device and providing the intermediate task results (e.g., the equivalent resistance) to the circuit simulation program 222; and
- Data 240 including information regarding the integrated circuit(s), circuit simulation instructions, intermediate simulation results provided by the solver program 230, final simulation results of the circuit simulation instructions, an equivalent resistance model 242 (e.g., a lookup table or a formula) associating an equivalent resistance of a channel of an irregular shaped transistor device with one or more combinations of values of a plurality of device characteristics (e.g., a dimension of a source, a channel length, etc.).

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various implementations. In some implementations, memory 206, optionally, stores a subset of the modules and data structures identified above. Furthermore, memory 206, optionally, stores additional modules and data structures not described above.

Figure 3A:
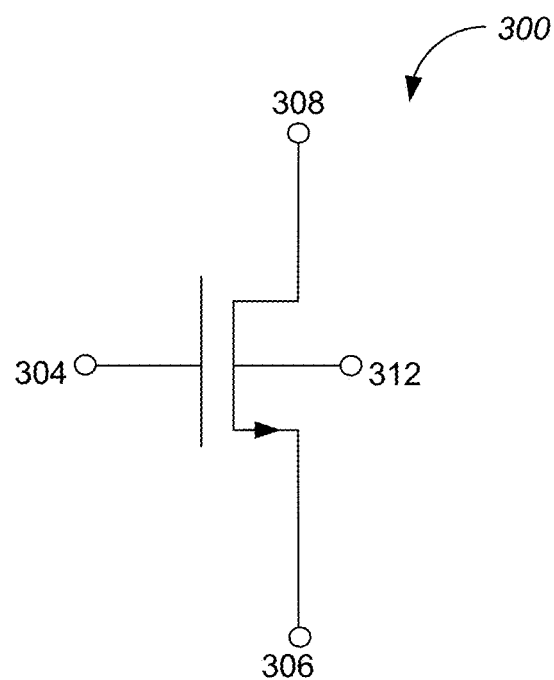
FIGS. 3A and 3B illustrate an electronic symbol and a cross section of a metal-oxide-semiconductor field effect transistor device in accordance with some embodiments, respectively.
Figure 3B:
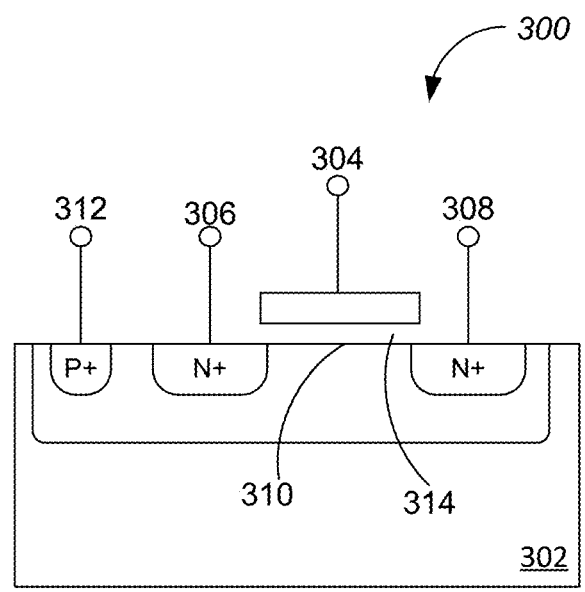
Figure 3C:
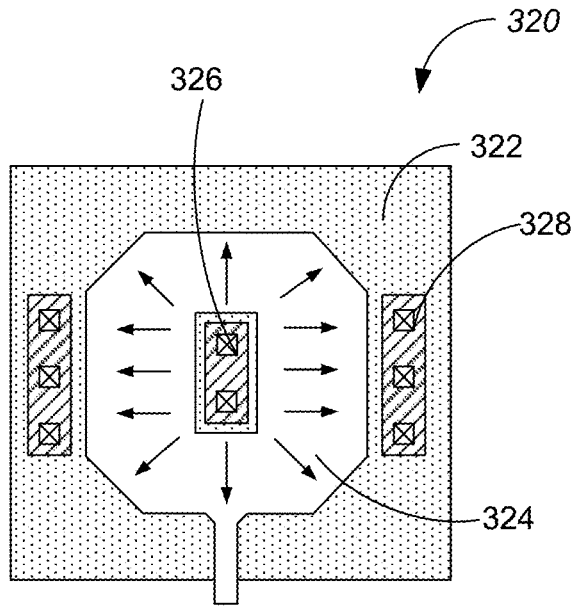
FIGS. 3C and 3D illustrate layouts of (i) a representative irregular shaped transistor device and (ii) a regular shaped transistor device having a transistor device width equal to an equivalent width of the irregular shaped transistor device in accordance with some embodiments, respectively.
Figure 3D:
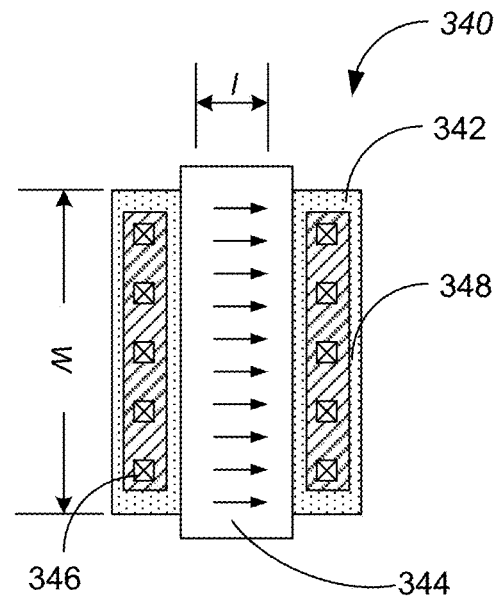

FIGS. 3A and 3B illustrate an electronic symbol and a cross section of a metal-oxide-semiconductor field effect transistor (MOSFET) device 300 in accordance with some embodiments, respectively. FIGS. 3C and 3D illustrate layouts of (i) a representative irregular shaped transistor device 320 and (ii) a regular shaped transistor device 340 having a transistor device width equal to an equivalent width of the irregular shaped transistor device in accordance with some embodiments, respectively. The transistor device 300 is formed on a semiconductor substrate and has a gate 304, a source 306, a drain 308 and a channel 310. For an n-type transistor device 300, the semiconductor substrate 302 includes at least an n-type device region (e.g., an n-type well formed by doping a p-type substrate) that is electrically coupled to a body terminal 312. Each of the source 306 and drain 308 includes a respective highly doped n-type terminal region formed in the n-type device region. Each of the source 306 and drain 308 of the n-type transistor device 300 includes a respective highly doped n-type terminal region formed in the n-type device region. For a p-type transistor device 300, the semiconductor substrate 302 includes at least a p-type device region (e.g., a p-type well formed by doping an n-type substrate 302') that is electrically coupled to a body terminal 312. Each of the source 306 and drain 308 of the p-type transistor device includes a respective highly doped p-type terminal region formed in the p-type device region. In the transistor device 300 (p-type or n-type), a channel region between the source 306 and drain 308 is covered by a layer of gate oxide 314 on which the gate 304 is disposed. When a gate voltage is applied to the gate 304 to turn on the transistor device 300, the channel 310 is formed on a top surface of the semiconductor substrate 302 (i.e., in the channel region) and a current flows between the source 306 and drain 308 in the channel 310.

Referring to FIG. 3D, the channel 310 of the regular shaped transistor device 340 has a rectangular shape defined by an overlapping area of the gate 344 and an active area 342. The active area 342 corresponds to the device region formed on the semiconductor substrate 302 for the transistor device 340. The source 346 and drain 348 are formed on two sides of the gate 304 and connected by the channel 310 of the rectangular shape. The channel 310 of the regular shaped transistor device 340 has a width W consistent with a width of the active area 342, and a length l that is reduced from a length of the gate by an expansion range of the source 346 and drain 348 under the gate 344. In an example SPICE model, the length l of the channel 310 is represented by the length of the gate 344 automatically corrected by a first expansion range caused by a manufacturing process and a second expansion range associated with specific operating conditions. In some implementations, the length of the channel 310 is so small that it is comparable to depletion layer widths of the source 346 and drain 348, i.e., the length l of the channel 310 is comparable to a combination of the first and second expansion ranges. The short length of the channel 310 may trigger short channel effects e.g., drain-induced barrier lowering, velocity saturation, and hot carrier degradation.

SPICE (Simulation Program for Integrated Circuit Engineering) simulators are used in design and verification of integrated circuit including transistor devices (e.g., the regular shaped transistor device 340). SPICE simulators are divided into three classes: first generation models (Level 1, Level 2, Level 3 Models), second generation models (Berkeley Short-channel IGFET Model (BSIM), HSPICE Level 28, BSIM2) and third generation models (BSIM3, Level 7, Level 8, Level 49, etc.). Some of the second and third generation SPICE simulators apply equations that have better convergence performance during circuit simulation, and are configured to address the short channel effects, local stress, transistor devices operating in a sub-threshold region, gate leakage (tunneling), noise calculations, and temperature variations.

Referring to FIG. 3C, in some embodiments, an irregular shaped transistor device 320 has a channel 310 of an irregular shape, e.g., a hollow octagonal shape. The irregular shape is defined by an overlapping area of the gate 324 and an active area 322 of the transistor device 320. The active area 322 corresponds to the device region formed on a semiconductor substrate for the transistor device 320. The gate 324 of the transistor device 320 has an octagonal shape with an opening in the center of the octagonal shape (i.e., has a hollow octagonal shape). One of the source 326 and drain 328 of the transistor device 320 is disposed in the opening of the gate 324 of the hollow octagonal shape, and the other one of the source 326 and drain 328 is disposed on the active area 322 and in proximity to a periphery of the gate 324. Whether a terminal in the opening of the gate 304 is the source 306 or drain 308 is determined by a type of the transistor device 320 and how the transistor device 320 is electrically coupled in the integrated circuit. For example, the transistor device 320 is an n-type MOSFET transistor device, and the terminal in the opening of the gate 304 is electrically coupled to a lower voltage level compared to the terminal in proximity to the periphery of the gate 304. The terminal in the opening of the gate 304 is the source of the transistor device 320, and the terminal in proximity to the periphery of the gate 304 is the drain of the transistor device 320.

In various embodiments of the application, when the irregular shaped transistor device 320 is used in integrated circuit, the integrated circuit is simulated with a circuit simulation program (e.g., SPICE programs) regardless of whether the circuit simulation program is capable of simulating electrical performance of the irregular shaped transistor device 320. That said, the integrated circuit is simulated with the circuit simulation program even when the program is not configured to simulate electrical performance of the irregular shaped transistor device 320. Instead, the circuit simulation program relies on an external solver program to identify an electrical characteristic (e.g., equivalent resistance of the channel 310) of the irregular shaped transistor device 320. Then, the circuit simulation program converts the irregular shaped transistor device 320 to the regular shaped transistor device 340 that is compatible with the circuit simulation program, and simulates the integrated circuit with the regular shaped transistor device 340 in place of the irregular shaped transistor device 320 based on the identified electrical characteristic.

In some embodiments, the external solver program is loaded and executed on the fly when the circuit simulation program encounters the irregular shaped transistor device 320 during the course of simulating the integrated circuit. Alternatively, the external solver program is executed to establish an electrical characteristic model (e.g., an equivalent resistance model) for a predetermined irregular shaped transistor device 320 before integrated circuit having such an irregular shaped transistor device is simulated by the circuit simulation program. The electrical characteristic model includes a lookup table or a formula that associates an electrical characteristic of the irregular shaped transistor device 320 with one or more device characteristics, e.g., associates an equivalent resistance of the channel 310 of the transistor device 320 with a dimension of the opening of the gate 304 of the transistor device 320. The electrical characteristic model is stored in a memory of the computer system 200. During the course of simulating the integrated circuit, the circuit simulation program does not execute the external solver program, but identifies the electrical characteristic of the irregular shaped transistor device 320 based on the electrical characteristic model stored in the memory of the computer system 200.

Figure 4:
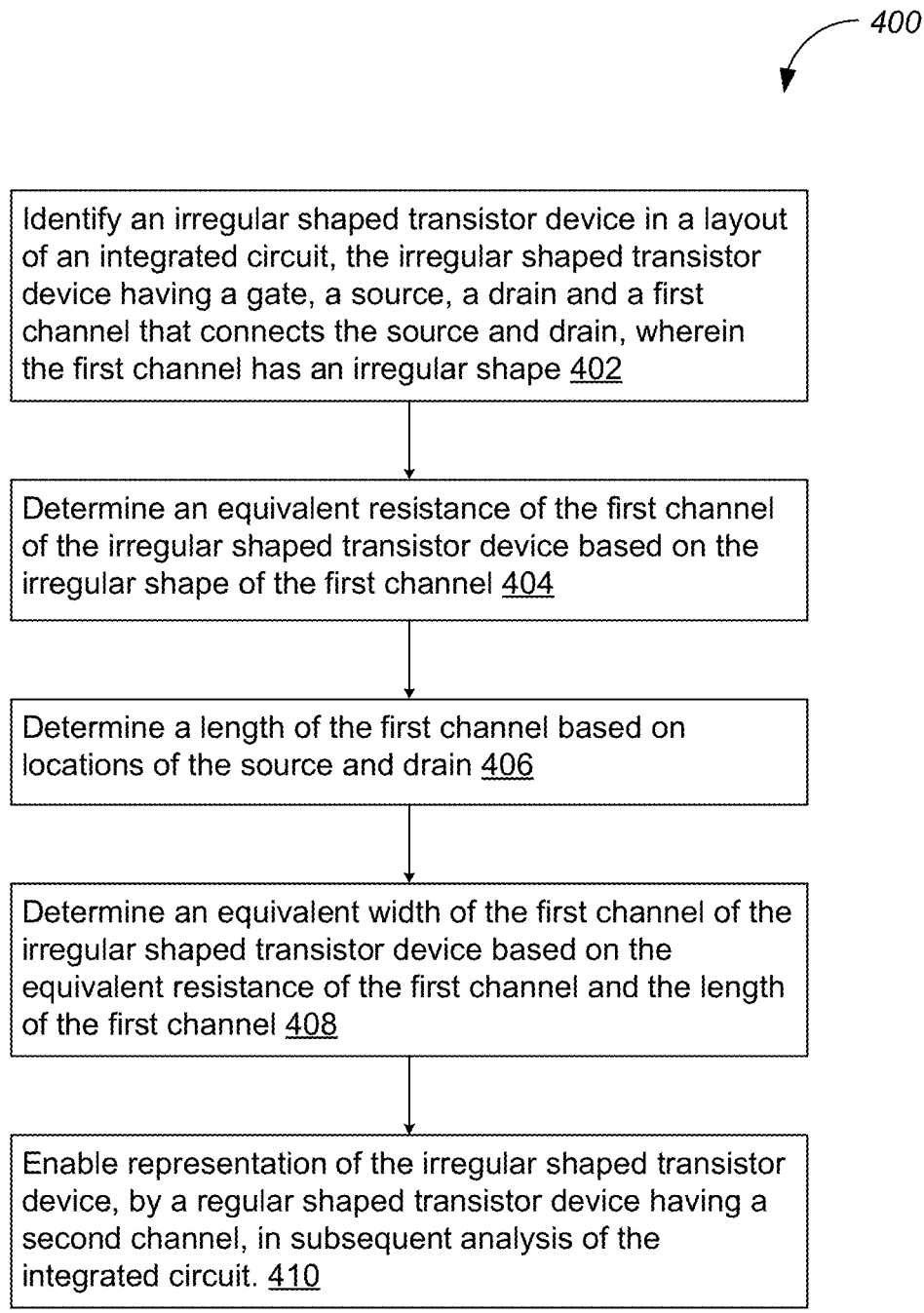
FIG. 4 illustrates a representative flow chart of a method for simulating integrated circuit including an irregular shaped transistor device in accordance with some embodiments.

FIG. 4 illustrates a representative flow chart of a method 400 for simulating integrated circuit including an irregular shaped transistor device (e.g., device 320 in FIG. 3) in accordance with some embodiments. The circuit simulation method 400 is implemented by the computer system 200 including one or more processors and memory. The computer system 200 identifies (402) an irregular shaped transistor device 320 in the integrated circuit. The irregular shaped transistor device 320 has a gate 324, a source 326, a drain 328 and a first channel that connects the source 326 and drain 328. The first channel has an irregular shape, and may be formed when a voltage bias is applied between the gate 324 and source 326. In some implementations, the computer system 200 executes a circuit simulation program 222, and identifies the irregular shaped transistor device 320 in the circuit simulation program 222. In some circumstances, the integrated circuit is represented by graphical or textual circuit schematics, and the irregular shaped transistor device 320 is described in a predefined format (e.g., a statement or symbol including a shape, a dimension of an opening, and/or a length of a gate of a transistor device 320) in the circuit schematics. Alternatively, in some circumstances, the integrated circuit is associated with a physical layout, and a netlist is generated from the physical layout to represent the integrated circuit. The netlist includes electronic components, connections among the components, and/or parasitics associated with the components and connections. The netlist is simulated by the circuit simulation program 222 to verify operation of the integrated circuit before the physical layout is applied to manufacture the integrated circuit. The circuit simulation program 222 identifies the irregular shaped transistor device 320 from the netlist.

An equivalent resistance Ras of the first channel of the irregular shaped transistor device 320 is determined (404) based on the irregular shape of the first channel. A solver program 230 (e.g., a field solver program, a device solver program) is involved in determining the equivalent resistance. As explained above, the solver program 230 may be executed to determine the equivalent resistance of the first channel of this specific irregular shaped transistor device 320 directly during the course of simulating the integrated circuit. In some embodiments related to on-the-fly solver simulation, the solver program 230 is executed in response to receiving from the circuit simulation program 222 a request including information of the integrated circuit (e.g., information of the irregular shaped transistor device 320). The solver program 230 then determines the equivalent resistance of the first channel of the irregular shaped transistor device 320, e.g., based on a small signal excitation model. Examples of the solver program 230 include a field solver program and a device solver program. The field solver program is configured to determine the equivalent resistance of the first channel based on analysis of an electrical field in the first channel, and the device solver program is configured to determine the equivalent resistance of the first channel based on current-voltage behavior of the irregular shaped transistor device.

Specifically, referring to FIG. 3C, a first terminal is associated with the source and a second terminal is associated with the drain. At least one of the first and second terminals is identified. When a field solver program is executed, the field solver program 230 determines S-parameters of the first channel 310 of the irregular shaped transistor device 320 in response to a small excitation signal inputted at the first terminal associated with the source 306, and converts the S-parameters to Z-parameters for the first channel 310 of the irregular shaped transistor device 320. The equivalent resistance of the first channel 310 are derived from the Z-parameters of the first channel 310. Alternatively, when a device solver program is executed, the device solver program 230 determines the equivalent resistance of the first channel of the irregular shaped transistor device based on direct current (DC) electrical behavior of the irregular shaped transistor devices. The device solver program 230 determines one or more current-voltage curves of the first channel of the irregular shaped transistor device in response to a DC voltage applied at the first terminal associated with the source and the equivalent resistance of the first channel based on the one or more current-voltage curves of the first channel. More details on circuit simulation based on on-the-fly solver simulation are discussed below with reference to FIGS. 6-8.

Alternatively, the solver program 230 may also be executed to determine an equivalent resistance model (e.g., a lookup table, a formula) that can be used in following circuit simulation to determine the equivalent resistance of the first channel of this specific irregular shaped transistor device 320. More details on applying an equivalent resistance model to simulate the irregular shaped transistor device 320 are discussed below with reference to FIGS. 9-11.

The circuit simulation program 222 also determines (406) a length l of the first channel of the irregular shaped transistor device, e.g., based on locations of the source and drain. Referring to FIG. 3C, in some embodiments, the length of the first channel 310 is determined as a distance between the source 306 and drain 308 averaged along a width of the first channel 310 of the irregular shaped transistor device 320 (i.e., 360 degrees around the perimeter of the gate 304). Alternatively, in some embodiments, a minimum length and a maximum length along the width of the first channel 310 of the irregular shaped transistor device 320, and the length of the first channel 310 is determined as an average of the minimum length and the maximum length. Alternatively, in some embodiments, a middle point along a width of the first channel 310 of the irregular shaped transistor device 320, and the length of the first channel is represented by a channel length at the middle point.

The circuit simulation program 222 determines (408) an equivalent width $W_{eq}$ of the first channel of the irregular shaped transistor device based on the equivalent resistance $R_{ds}$ of the first channel and the length l of the channel. In an example, a sheet resistance $R_{SH}$ of the first channel of the irregular shaped transistor device 320 is determined, and the equivalent width $W_{eq}$ of the first channel of the irregular shaped transistor device 320 is determined (410) based on the sheet resistance $R_{SH}$ and the length l of the first channel as $W_{eq}=(R_{SH}/R_{ds})\times l$. As such, the irregular shaped transistor device 320 can be represented with a regular shaped transistor device 340 having a second channel in subsequent analysis of the integrated circuit. The second channel optionally has a rectangular shape measured by the equivalent width $W_{eq}$ and the length l of the irregular shaped transistor device.

Figure 5A:
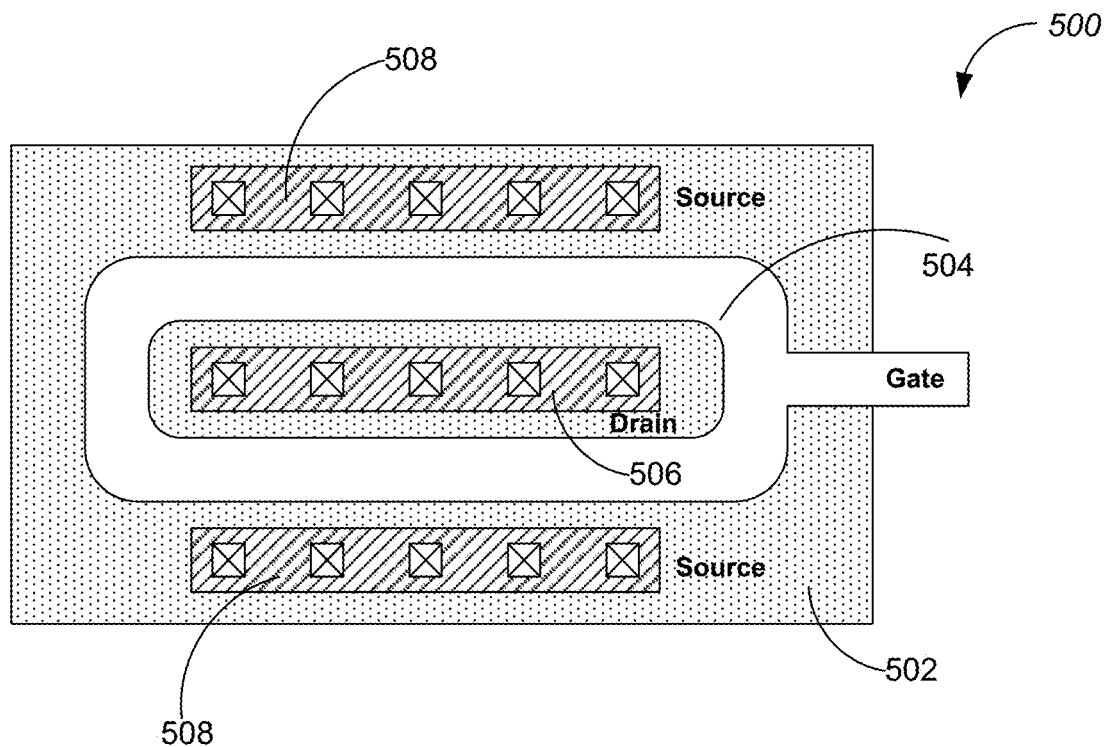
FIGS. 5A-5E illustrate five representative irregular shaped transistor devices that can be converted and simulated using a circuit simulation method shown in FIG. 4 in accordance with some embodiments.
Figure 5B:
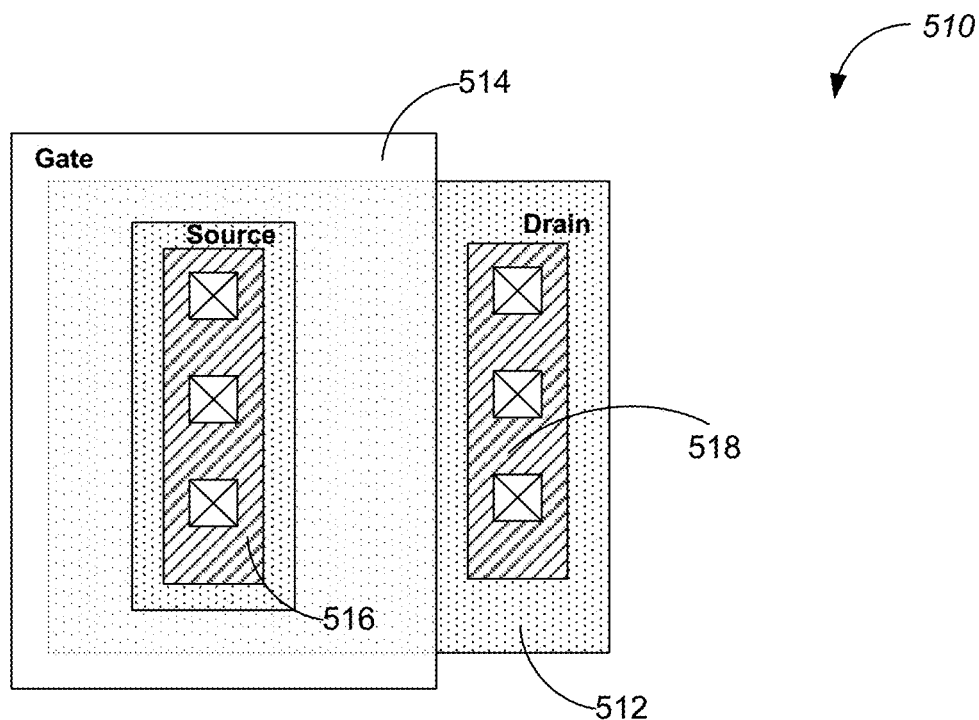

FIGS. 5A-5E illustrate five representative irregular shaped transistor devices 500, 510, 520, 530 and 540 that can be converted and simulated using a circuit simulation method 400 shown in FIG. 4 in accordance with some embodiments. Each of the irregular shaped transistor devices 500, 510, 520, 530 and 540 has a respective channel having an irregular shape, and the irregular shape of the respective channel is defined by an overlapping area of a gate and an active area (e.g., the active areas 502, 512, 522, 532 and 542) of the respective irregular shaped transistor device. Referring to FIG. 5A, the gate 504 and the channel of the irregular shaped transistor device 500 have a hollow rectangular shape with rounded corners. One of the source 506 and drain 508 is formed inside a central opening of the gate 504, and the other one of the source 506 and drain 508 is formed in proximity to an external periphery of the gate 504. Referring to FIG. 5B, the gate 514 and the channel of the irregular shaped transistor device 510 have a hollow rectangular shape. The gate 514 is extended beyond and covers at least one side of the active area 512 (e.g., three sides in FIG. 5B). One of the source 516 and drain 518 is formed inside a central opening of the gate 514, and the other one of the source 516 and drain 518 is formed in proximity to an external periphery of the gate 514 (e.g., only on the active area 512 that extends beyond a side of the gate 514). The shapes of the irregular shaped transistor devices 500 and 510 are mainly configured to reduce their susceptibility to electromagnetic radiation compared with a regular shaped transistor device.

Figure 5C:
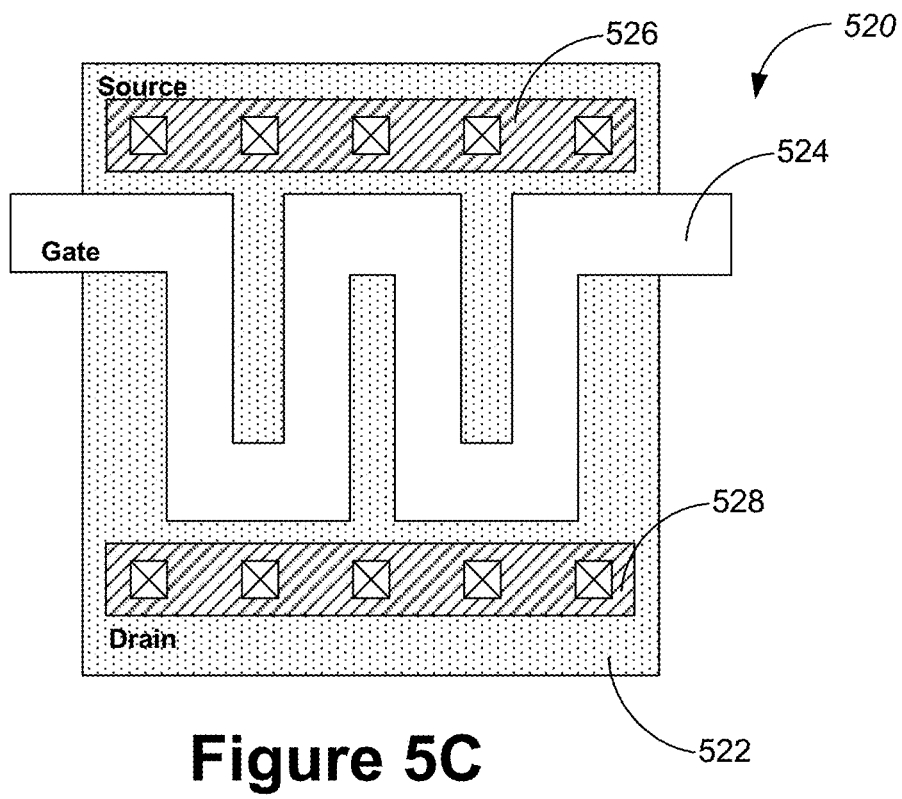

Referring to FIG. 5C, the gate 524 and the channel of the irregular shaped transistor device 520 have a serpentine shape. The source 526 and drain 528 are formed on two opposite sides of the serpentine shape of the gate 504. The length of the channel l is a width of a zigzag path of the serpentine shape.

Figure 5D:
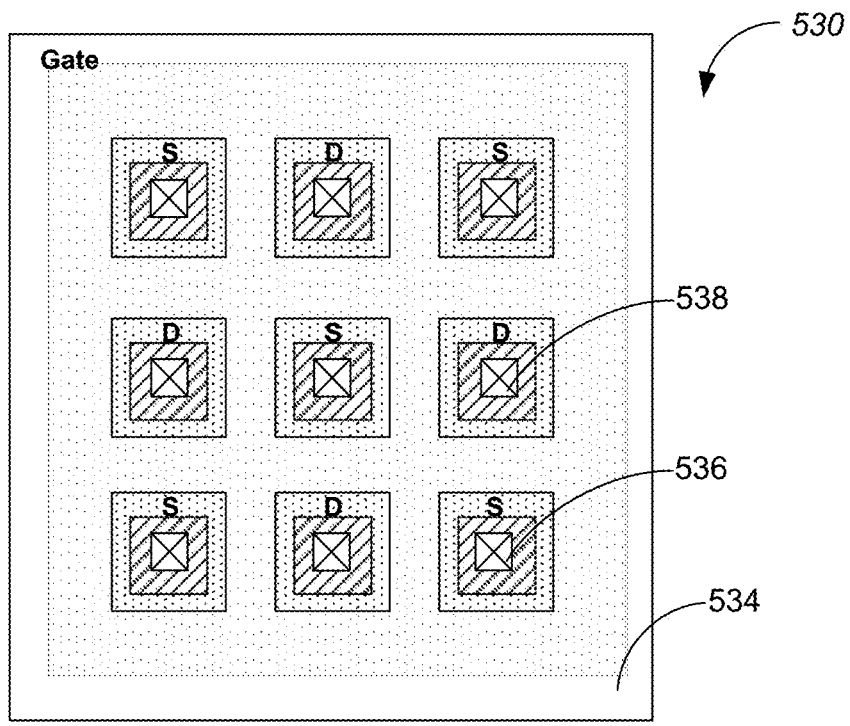
Figure 5E:
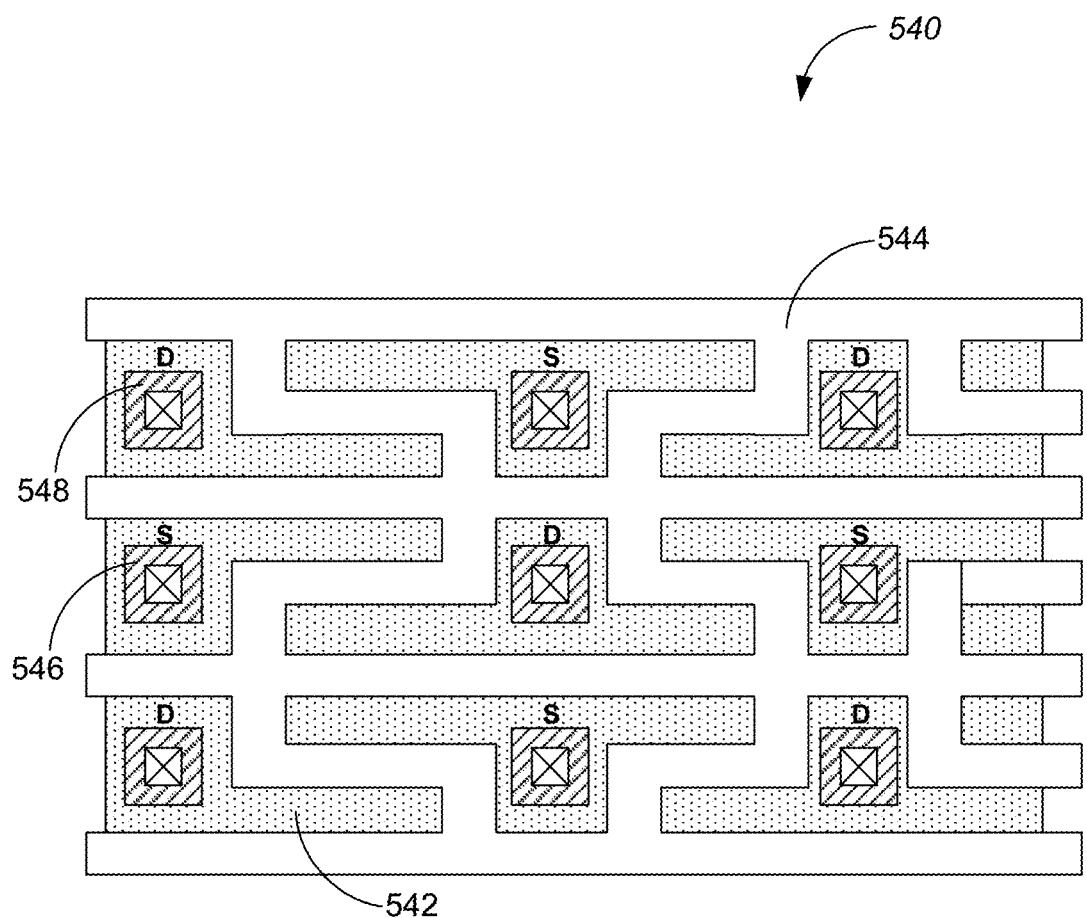

Referring to FIG. 5D, the gate 534 covers the entire active area of the irregular shaped transistor device 530. The gate 534 has a rectangular shape with an array of openings (i.e., a waffle shape), and each opening is configured to accommodate a set of contacts (e.g., one contact) to form the source 536 or drain 538. In this example, the source 536 and drain 538 are disposed in nine openings of the gate 534 alternatingly. Each source 536 is only disposed on the top, bottom, left side or right side of another drain 538, and each drain 538 is only disposed on the top, bottom, left side or right side of another source 536. Every two adjacent sources 536 or drains 538 are disposed diagonal to each other. The width W of the channel of the irregular shaped transistor device 530 is a combination of a width of a sub-channel associated with each pair of source 536 and drain 538, and the solver program 230 is configured to provide an equivalent width $W_{eq}$. The length of the channel of the irregular shaped transistor device 530 is a width of the gate 534 that separates every two adjacent openings, Referring to FIG. 5E, the irregular shaped transistor device 540 includes zigzag paths to further increase its channel width. The gate 544 includes a grid that is formed with horizontal bars and zigzag paths, and includes a plurality of openings. Each opening is configured to accommodate a set of contacts (e.g., one contact) to form the source 546 or drain 548. In this particular example, the source 546 and drain 548 are disposed in nine openings of the gate 544 alternatingly. Each source 546 is only disposed on the top, bottom, left side or right side of another drain 548, and each drain 548 is only disposed on the top, bottom, left side or right side of another source 546. Every two adjacent sources 546 or drains 548 are disposed diagonal to each other. The width of the channel of the irregular shaped transistor device 540 is a combination of a width of a sub-channel associated with each pair of source 546 and drain 548, and the solver program 230 is configured to provide an equivalent width $W_{eq}$. The shapes of the irregular shaped transistor devices 520, 530 and 540 are mainly configured to improve usage of a chip area compared with a regular shaped transistor device, i.e., accommodate a larger transistor device within a given chip area.

Figure 6A:
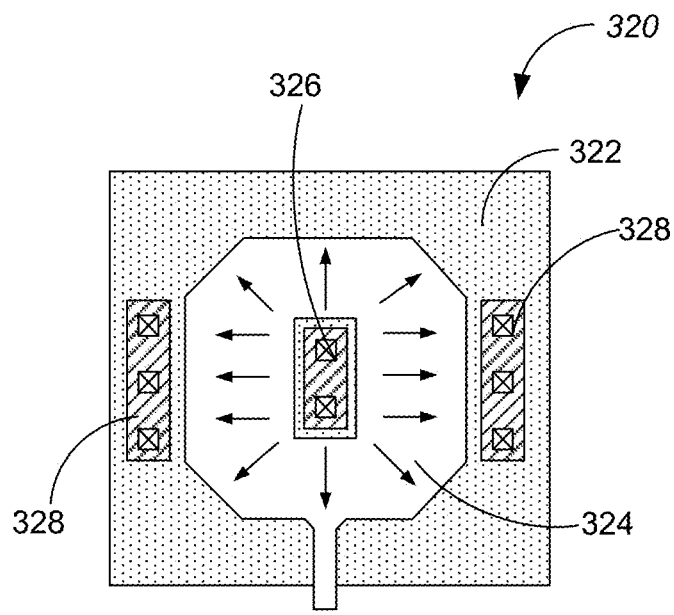
FIG. 6A illustrates a top view of a hollow octagonal transistor device (also called an annular transistor device in this application)
Figure 6B:
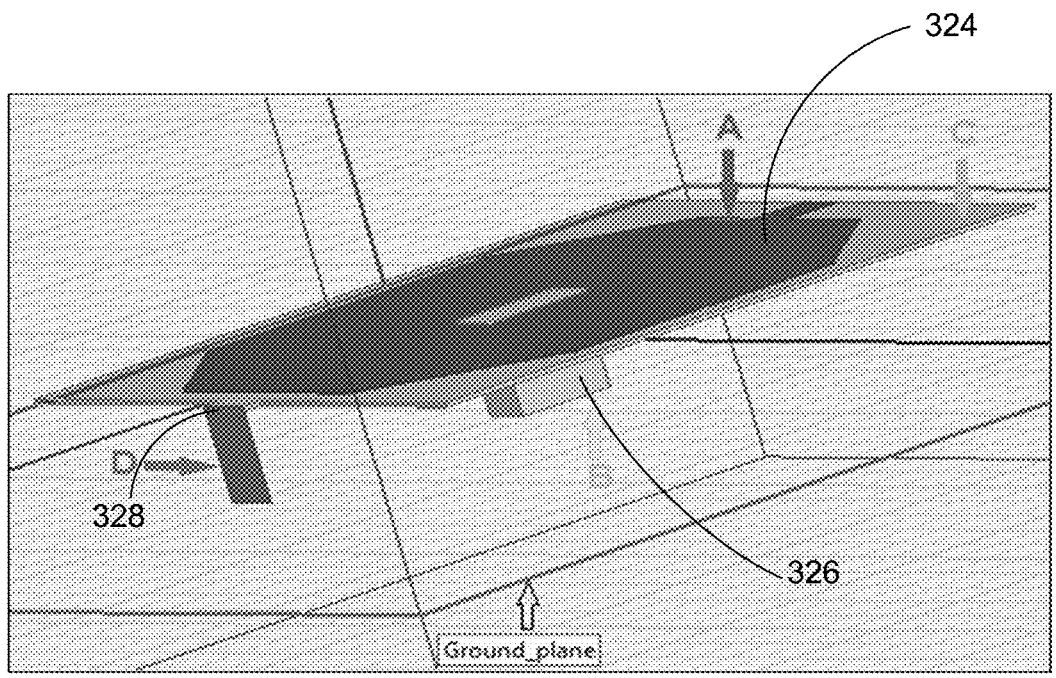
FIG. 6B illustrates a perspective representation of the hollow octagonal transistor device shown in FIG. 6A in a field solver environment in accordance with some embodiments.
Figure 7A:
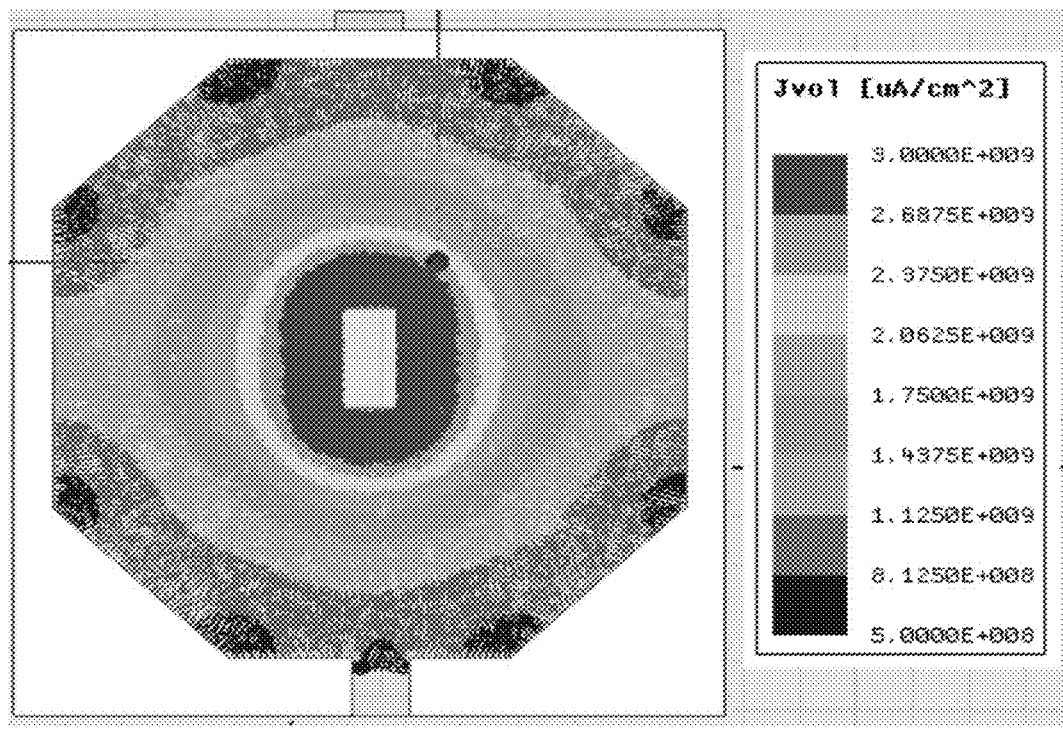
FIGS. 7A and 7B illustrate current density and equivalent resistance of a channel of the annular transistor device, determined in the field solver environment, in accordance with some embodiments, respectively.
Figure 7B:
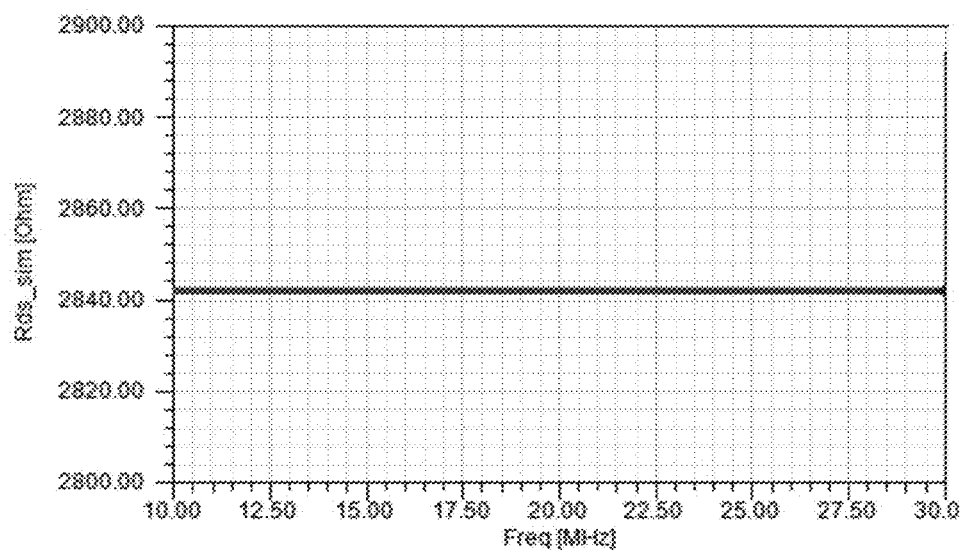

FIG. 6A illustrates a top view of a hollow octagonal transistor device 320 (also called an annular transistor device 320 in this application) and FIG. 6B illustrates a perspective representation of the hollow octagonal transistor device 320 shown in FIG. 6A in a field solver environment in accordance with some embodiments. FIGS. 7A and 7B illustrate current density and equivalent resistance of a channel of the annular transistor device 320, determined in the field solver environment, in accordance with some embodiments, respectively. In the field solver environment, a field solver program (e.g., a solver program 230 in FIG. 2) is configured to solve Maxwell equations to calculate electric and magnetic fields in a high frequency operation range. The Maxwell equations are also used to calculate small signal parameters in one or more lower frequency ranges. As a result of solving the Maxwell equations, the field solver program provides a set of complex S-parameters as a function of parameters (e.g., frequency, operating point), and the set of complex S-parameters are converted to other small signal parameters, such as Y-, Z- or H-parameters. The field solver program is optionally applied to determine one or both of the equivalent resistance $R_{ds}$ and equivalent width $W_{eq}$ of the annular transistor device 320. Examples of the field solver program include ANSYS HFSS (a 3D electromagnetic simulation software).

A channel is formed under a gate 324 of the annular transistor device 320. The channel includes a uniform conductive layer in an active operation mode, when a drain current between a source 326 and a drain 328 is substantially small (e.g., lower than a threshold drain current). The uniform conductive layer is formed in an active area 322 of the annular transistor device 320 and is connected to the source 326 and drain 328.

Resistance $R_{ds}$ of a channel of a regular shaped transistor device 340 is approximated as:

$$R_{ds}=(l/W)*R_{SH} \qquad (1)$$

where L, W are the MOSFETs gate length and width, respectively, and $R_{SH}$ represents a sheet resistance of a corresponding channel. The sheet resistance $R_{SH}$ is expressed as:

$$R_{SH}=1/(C_{ox}*\mu*(V_{gs}-V_{th})) \qquad (2)$$

where $C_{ox}$ is gate oxide capacitance per unit area, µ is carrier mobility in the channel, $V_{gs}$ is the voltage difference between the gate 324 and source 326, and $V_{th}$ is a threshold voltage of the regular shaped transistor device 340. Referring to FIGS. 3C and 3D, if $C_{ox}$, µ, L and $V_{th}$ of the irregular shaped transistor device 320 are assumed to be the same as what these parameters of a regular shaped device 340, the irregular shaped transistor device 320 shows the same electrical performance as the regular shaped transistor device 340. These parameters (e.g., $C_{ox}$, µ, L and $V_{th}$) do not exhibit large variations or sudden changes as a function of shape and dimension. As such, the field solver program is configured to determine the resistance $R_{ds}$ (i.e., the equivalent resistance) by simulations for a chosen value of the sheet resistance $R_{SH}$, and the equivalent width $W_{eq}$ of the channel of the irregular shaped transistor device 320 is derived and used to predict electrical performance of the irregular shaped transistor device 320.

To determine the equivalent resistance $R_{ds}$, the field solver program represents the channel of the irregular shaped transistor device 320 with a single resistive layer structure. The dimension of the single resistive layer structure is defined by an intersection of the gate 324 and the active are 322. A respective area associated with each of the source and drain regions is assumed to be equipotential, and represented by an ideal conductor touching the channel from both sides of the gate 324. In some embodiments of a one-port configuration, the drain 328 is connected to a ground plate using an ideal conductor, and the source 326 is attached to a lumped terminal port. Alternatively, in some embodiments of the one-port configuration, the source 326 is connected to a ground plate using an ideal conductor, and the drain 328 is attached to a lumped terminal port. Alternatively, in some embodiments of a two-port configuration, two terminal ports are applied, and each of the source 326 and drain 328 is coupled to one of the two terminal ports.

The field solver program analyzes the single resistive layer structure to determine S-parameters describing the response of the structure to a small signal excitation, e.g., in the frequency range below 100 MHz where the impact of parasitic capacitance and inductance is substantially negligible. FIG. 7A illustrates current density of the channel of the annular transistor device 320 simulated from the single resistive layer structure by the field solver program. The S-parameter values are further converted to a set of Z-parameters. The Z-parameters are used to calculate the equivalent channel resistance $R_{ds}$ as:

$$R_{ds}=\mathrm{Re}(Z_{11}) \text{ for one-port configuration,} \qquad (3)$$

or $$R_{ds}=\mathrm{Re}(Z_{11}\pm Z_{22}-Z_{12}-Z_{21}) \text{ for two-port configuration.} \qquad (4)$$

Given that the value of $R_{ds}$ can also be expressed as $(L/W_{eq})*R_{SH}$ as shown in equation (1), the equivalent width ($W_{eq}$) of the channel of the irregular shaped transistor device 320 is derived as follows:

$$W_{eq}=L*(R_{SH}/R_{ds}) \quad (5)$$

In an example, an internal gate perimeter of the irregular shaped transistor device 320 is 6.73 μm, and the gate length is 5 μm. The single resistive layer structure has a resistivity of 0.1 Ω·cm, and a thickness of 0.1 μm, and the sheet resistance of the single resistive layer structure is $10^4$ Ω/square. FIG. 7B illustrates a frequency spectrum of equivalent resistance $R_{ds}$ of the channel of the annular transistor device 320 as determined by field solver simulations and equation (3). The equivalent width $W_{eq}$ of the channel of the annular transistor device 320 is therefore determined to be 17.59 μm. It is noted that the solver program 230 is configured to provide any of the Z-parameters, the equivalent resistance $R_{ds}$ and the equivalent width $W_{eq}$ of the channel of the irregular shaped transistor device 320 to the circuit simulation program 222. The circuit simulation program 222 is configured to use the equivalent width $W_{eq}$ directly if provided, apply equations (4) and (5) to obtain the equivalent width $W_{eq}$ from the Z-parameters, or apply equation (5) to obtain the equivalent width $W_{eq}$ from equivalent resistance $R_{ds}$.

In some embodiments, the length l of the channel of the irregular shaped transistor device 320 is determined based on a physical layout of the irregular shaped transistor device 320. For example, the length l of the channel is an average distance between the drain 328 and source 326 or a distance at a specific location of the physical layout (e.g., a center point of each source or drain). As a result, the irregular shaped transistor device 320 can be represented with a regular shaped transistor device 340 having a second channel in subsequent analysis of the integrated circuit. The second channel optionally has a rectangular shape measured by the equivalent width $W_{eq}$ and the length l of the irregular shaped transistor device.

It is noted that in some implementations, a device solver program (not shown) is applied to solve an equivalent resistance of a first channel of an irregular shaped transistor on the fly or build an equivalent resistance model associated with the first channel of the irregular shaped transistor in advance. For on-the-fly determination, the device solver program is executed in response to a request to determine the equivalent resistance of the first channel. The device solver program determines the equivalent resistance of the first channel of the irregular shaped transistor device based on direct current (DC) electrical behavior of the irregular shaped transistor device, i.e., determines one or more current-voltage curves of the first channel in response to a DC voltage applied at the first terminal associated with the source and determines the equivalent resistance of the first channel based on the one or more current-voltage curves of the first channel. For building the equivalent resistance model, the device solver program is executed prior to receiving the request to determine the equivalent resistance of the first channel. Rather, one or more combinations of values of the device characteristics are identified for the first channel. For each combination, the device solver program determines current-voltage curves and a respective equivalent resistance of the first channel.

Figure 8A:
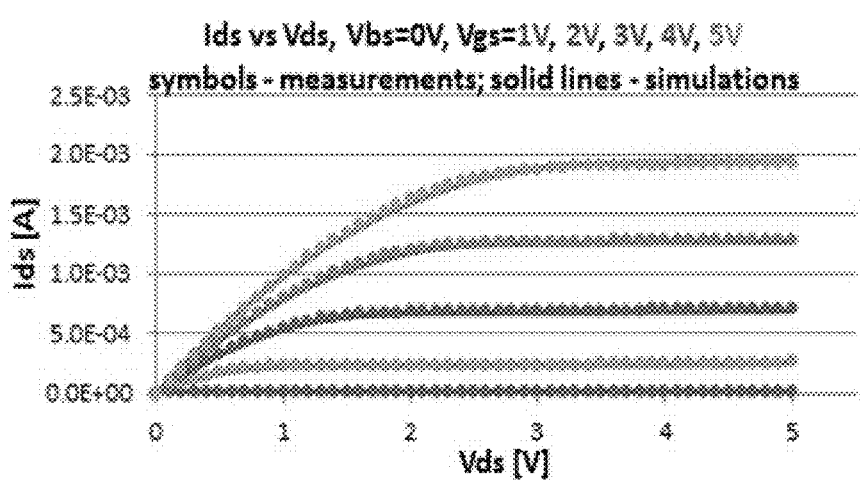
FIGS. 8A-8C illustrate currents between a source and a drain of an annular transistor device under different operating conditions in accordance with some embodiments.
Figure 8B:
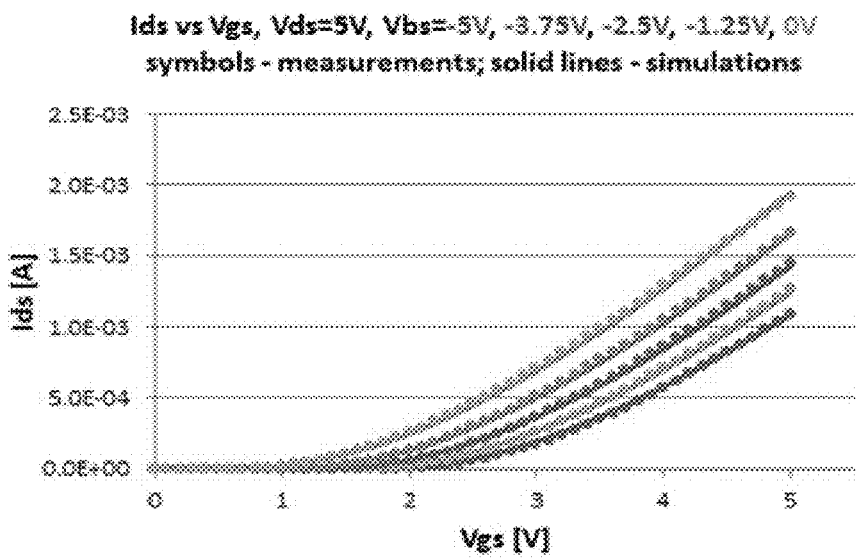
Figure 8C:
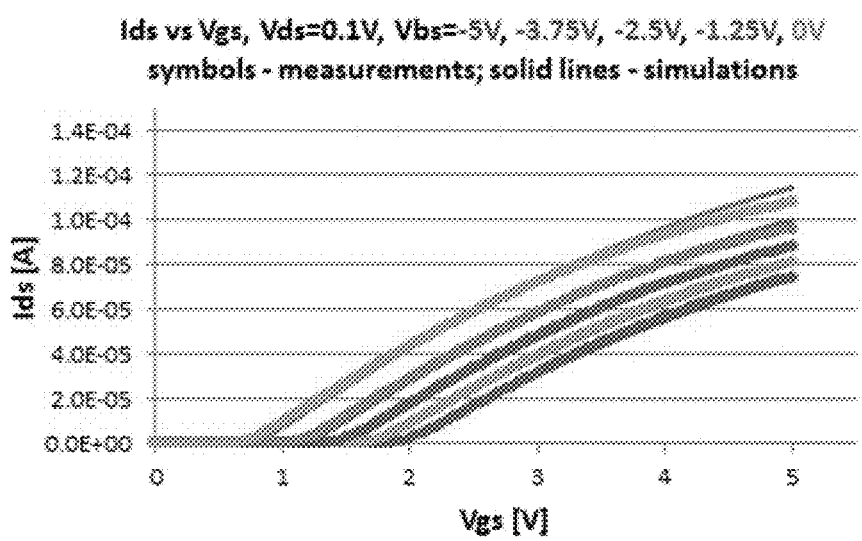

FIGS. 8A-8C illustrate currents 820, 840 and 860 between a source 326 and a drain 328 of an annular transistor device 320 under different operating conditions in accordance with some embodiments. The currents 820, 840 and 860 are simulated by a circuit simulation program 222 (e.g., a SPICE modelling program). During simulation, the annular transistor device 320 is represented with a regular shaped transistor device 340 having a rectangular shape measured by an equivalent width $W_{eq}$ determined by a field solver program and a length l of a first channel of the annular transistor device 320. As an alternative, the currents 820, 840 and 860 are also measured directly from the annular transistor device 320 that has been manufactured. As shown in FIGS. 8A-8C, the simulated currents are substantially consistent with the actual measured currents, thereby indicating that the circuit simulation method 400 approximating an irregular shaped transistor device with a regular shaped transistor device is plausible and reliable.

In this example, the irregular shaped transistor device 320 has an internal gate perimeter of 6.73 μm and a gate length of 5 μm. The equivalent width $W_{eq}$ of the channel of the annular transistor device 320 is determined to be 17.59 μm by the filed solver program. The equivalent width $W_{eq}$ is provided to a SPICE modelling program to simulate current characteristics as shown in FIGS. 8A-8C. Each current curve 820 represents a drain-to-source current $I_{ds}$ as a function of a drain-to-source voltage $V_{ds}$ under different gate-to-source voltages $V_{gs}$. Each current curve 840 represents a saturation current between the source 326 and drain 328 as a function of the gate-to-source voltage $V_{gs}$ under different body-to-source voltages $V_{bs}$. Each current curve 860 represents the drain-to-source current $I_{ds}$ as a function of the gate-to-source voltage $V_{gs}$ under different body-to-source voltages $V_{bs}$.

Figure 9:
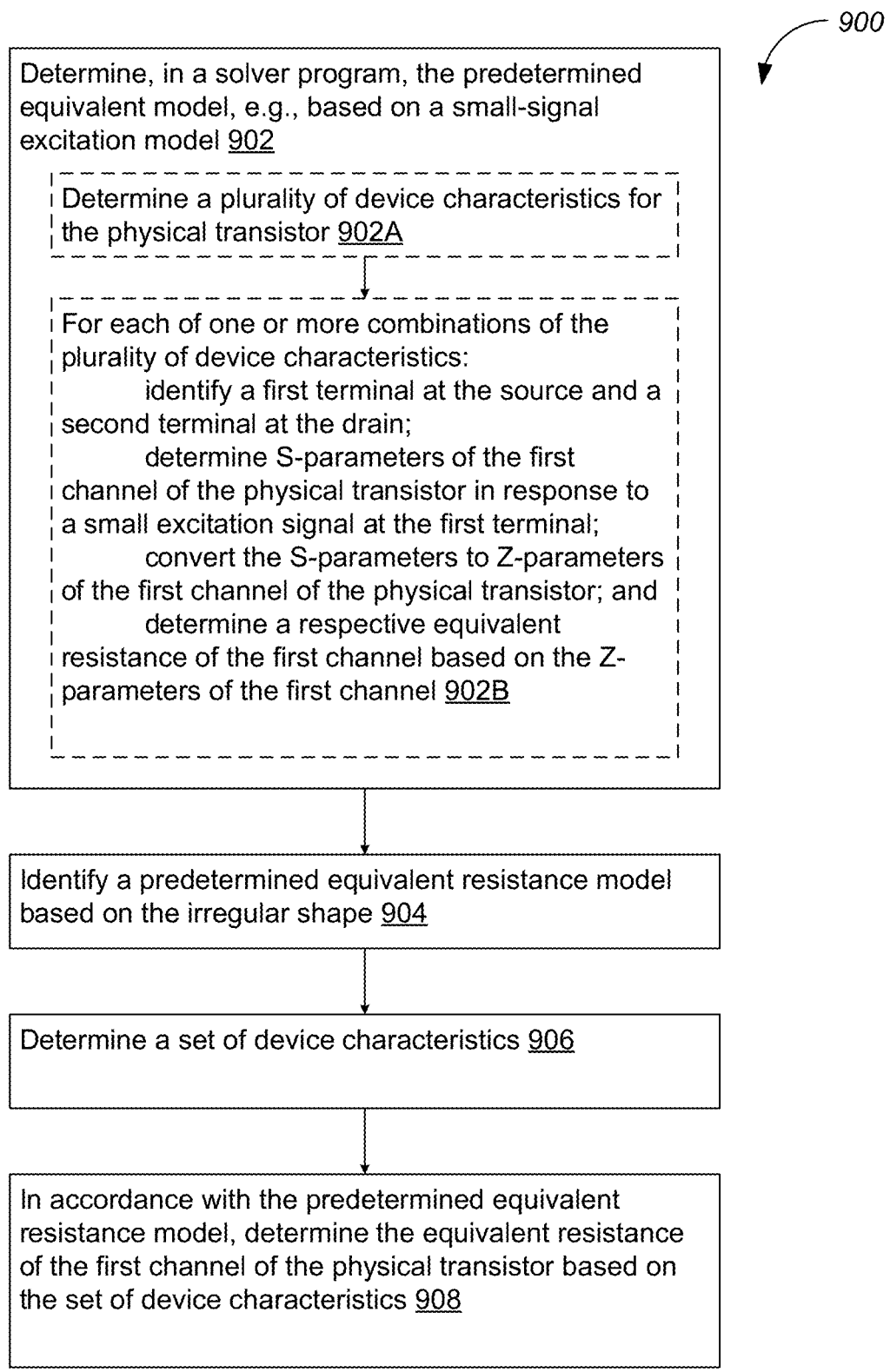
FIG. 9 illustrates a representative flow chart of a method for identifying an equivalent resistance of an irregular shaped transistor device based on a predetermined equivalent resistance model in accordance with some embodiments.
Figures 10A, 10B:
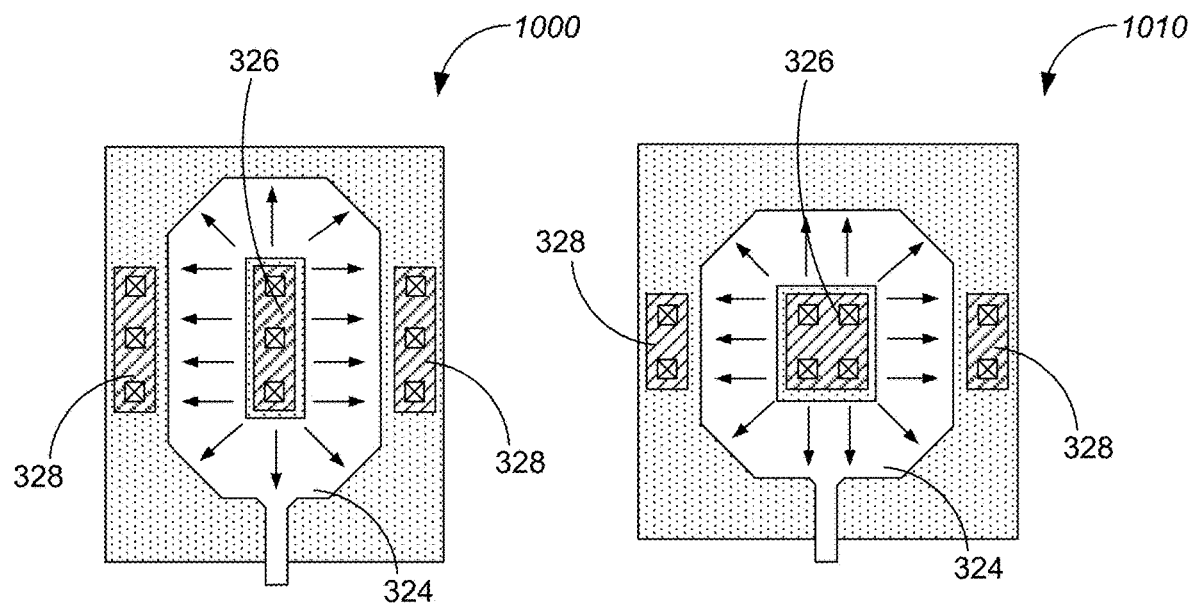
FIGS. 10A-10C illustrate three representative annular transistor devices having distinct channel dimensions in accordance with some embodiments.
Figure 10C:
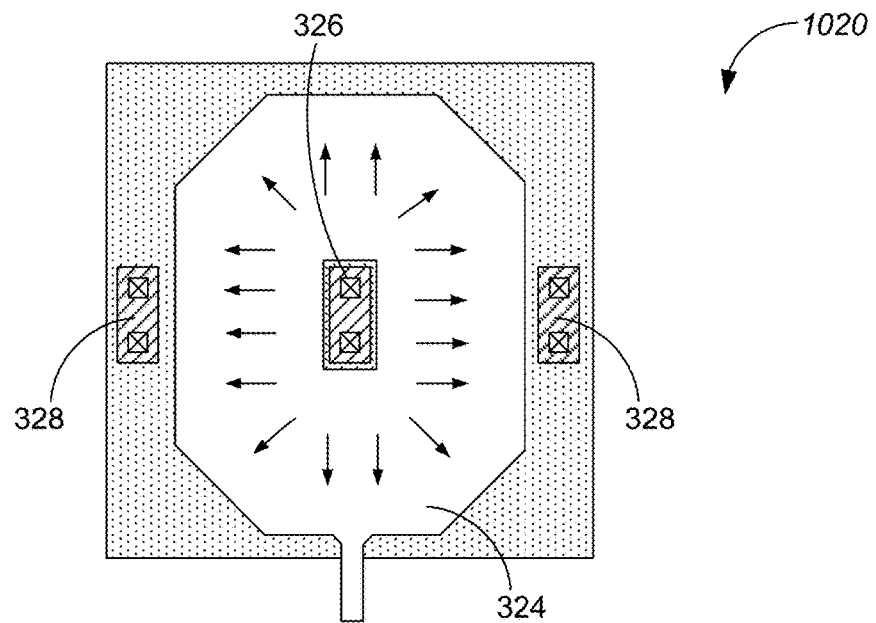

FIG. 9 illustrates a representative flow chart of a method 900 for identifying an equivalent resistance $R_{ds}$ of an irregular shaped transistor device 320 based on a predetermined equivalent resistance model in accordance with some embodiments. FIGS. 10A-10C illustrate three representative annular transistor devices 1000, 1010 and 1020 having distinct channel dimensions in accordance with some embodiments. FIG. 11A illustrates an example equivalent resistance model 1100 for irregular shaped transistor devices shown in FIGS. 3C and 10A-10C, and FIG. 11B illustrates characteristics 1110 of an irregular shape transistor device that is not included in the lookup table shown in FIG. 11A in accordance with some embodiments.

In some embodiments, the solver program 230 are executed to determine (902) the equivalent resistance model, and the equivalent resistance model is stored in the memory of the computer device 200, such that it can be extracted by a circuit simulation program 222 in following circuit simulation to determine an equivalent resistance of a channel of an irregular shaped transistor device corresponding to the equivalent resistance model. By these means, the solver program 230 are not loaded and executed while the circuit simulation program is simulating integrated circuit including the irregular shaped transistor device, and the circuit simulation program 222 does not need to be suspended to wait for the solver program 230 to provide information related to the equivalent resistance $R_{ds}$ of the first channel of the irregular shaped transistor device.

In some embodiments, the predetermined equivalent resistance model includes a lookup table associating one or more combinations of values of a plurality of device characteristics (e.g., shape, channel length, and opening dimensions) with a respective equivalent resistance $R_{ds}$ of a channel of the irregular shaped transistor device. For example, a representative lookup table is established using the solver program to associate the annular transistor device 320 of different channel lengths and opening dimensions with equivalent resistances (FIG. 11A). Referring to FIGS.

10A-10C, the opening dimensions of the annular transistor devices 320 are related to a width and length of an opening on the gate 324 having the hollow octagonal shape. The opening dimensions indirectly determine a size of the irregular shaped transistor device 320 and the equivalent width $W_{eq}$ of the corresponding first channel of the transistor device 320. The annular transistor device 320 in FIG. 3C has a column of two unit contacts in the opening of the gate 324. The annular transistor device 1010 or 1020 in FIG. 10A or 10B have a column of three unit contacts and two columns of two contacts in the opening of the gate 324, respectively. The annular transistor devices 320, 1010 and 1020 have a channel length l (e.g., 3 μm), and the annular transistor device 1030 in FIG. 10C has a channel length 2 l or 3 l (e.g., 6 or 9 μm). As such, the solver program 230 is executed to identify the equivalent resistance of the channel for each of the annular transistor devices 320, 1010, 1020 and 1030, thereby establishing the equivalent resistance model 1100 for these annular transistor device having a channel of a hollow octagonal shape. More details on identifying the equivalent resistance for each of the annular transistor devices 320, 1010, 1020 and 1030 using the solver program 230 are discussed with reference to FIGS. 6A-6B.

More specifically, in some implementations, the solver program 230 determines the equivalent resistance model 1100, e.g., based on a small signal excitation model or current-voltage curves. The solver program 230 identifies (902A) a plurality of device characteristics of the irregular shaped transistor device (e.g., gate opening dimensions, channel length), and generates one or more combinations of values of the plurality of device characteristics. In an example, each combination of the values of the device characteristics corresponds to an equivalent resistance of the equivalent resistance model 1100. In an example, for each combination of the values of the device characteristics, the solver program 230 (e.g., a field solver program) identifies (902B) at least one of a first terminal associated with the source and a second terminal associated with the drain, determines S-parameters of the channel of the irregular shaped transistor device in response to a small excitation signal at the first terminal associated with the source, converts the S-parameters to Z-parameters of the channel of the irregular shaped transistor device, and determines a respective equivalent resistance of the channel based on the Z-parameters. In another example, for each combination of the values of the device characteristics, the solver program 230 (e.g., a device solver program) determines current-voltage curves of the channel of the irregular shaped transistor device, and a respective equivalent resistance of the first channel accordingly.

It is noted that in some embodiments, the equivalent resistance model 1100 is represented by a formula associating each of the one or more combinations of values of the plurality of device characteristics with the respective equivalent resistance of the channel of the irregular shaped transistor device. A similar equivalent resistance model can be established for each type of irregular shaped transistor device (e.g., the transistor device 500, 510, 520, 530 or 540).

During the course of simulating the integrated circuit including the irregular shaped transistor device, the circuit simulation program identifies (904) the irregular shaped transistor device and the equivalent resistance model associated with the irregular shaped transistor device. A set of device characteristics of the irregular shaped transistor device are determined (906). The set of device characteristics includes a subset of a size of the source, a size of the drain, a distance of the source and drain and a number of unit contacts used to fill the opening of the gate. In some embodiments, the set of device characteristics of the irregular shaped transistor device are directly used (908) to identify a corresponding equivalent resistance in the equivalent resistance model. The set of device characteristics is consistent with, and can be directly compared with the plurality of device characteristics in the equivalent resistance model. In some embodiments, the set of device characteristics of the irregular shaped transistor device is not included in the plurality of device characteristics in the model, and are converted (908) to derive those applied in the equivalent resistance model, before the corresponding equivalent resistance can be identified according to the equivalent resistance model.

In some embodiments, the equivalent resistance of the first channel of the irregular shaped transistor device is not included in the lookup table 1100, and is interpolated from two of the equivalent resistances in the lookup table. For example, the annular transistor devices 320 has a column of two contacts in the opening of the gate 324 and a channel length of 8 μm. The corresponding equivalent resistance is interpolated (e.g., linearly) from two equivalent resistances corresponding to two channel lengths of 6 μm and 9 μm in the lookup table 1100.

It will be understood that, although the terms "first," "second," etc. may be used herein to describe various elements, these elements should not be limited by these terms. These terms are only used to distinguish one element from another. For example, a first channel could be termed a second channel, and, similarly, a second contact could be termed a first channel, which changing the meaning of the description, so long as all occurrences of the "first channel" are renamed consistently and all occurrences of the second channel are renamed consistently. The first channel and the second channel are both channels, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A circuit simulation method, comprising:
at a computer system including one or more processors and memory:
identifying an irregular shaped transistor device in an integrated circuit computer model, the irregular shaped transistor device having a first active area, a first gate, a first source, a first drain, and a first channel that connects the first source and the first drain, wherein the first channel has an irregular shape defined by design as a non-rectangular area where the first gate overlaps the first active area;
determining using a solver program an equivalent resistance of the first channel of the irregular shaped transistor device based on the irregular shape of the first channel;
determining a first length of the first channel;
determining a first width of the first channel of the irregular shaped transistor device based on the equivalent resistance of the first channel and the first length of the first channel; and
converting the irregular shaped transistor device to a regular shaped transistor device having a second active area, a second gate, a second source, a second drain, and a second channel defined by a rectangular area in subsequent analysis of the integrated circuit computer model, where the second gate overlaps the second active area, and has a second width and a second length that are equivalent to the first width and the first length of the first channel of the irregular shaped transistor device.

2. The method of claim 1, wherein determining using the solver program the equivalent resistance of the first channel of the irregular shaped transistor device further includes:
executing a field solver program; and
determining, in the field solver program, the equivalent resistance of the first channel of the irregular shaped transistor device based on a small signal excitation model, further including:
identifying at least one of a first terminal associated with the first source and a second terminal associated with the first drain;
determining S-parameters of the first channel of the irregular shaped transistor device in response to a small excitation signal at the first terminal associated with the first source;
converting the S-parameters to Z-parameters of the first channel of the irregular shaped transistor device; and
determining the equivalent resistance of the first channel based on the Z-parameters of the first channel.

3. The method of claim 1, wherein determining using the solver program the equivalent resistance of the first channel of the irregular shaped transistor device further includes:
executing a device solver program; and
determining, in the device solver program, the equivalent resistance of the first channel of the irregular shaped transistor device based on direct current (DC) electrical behavior of the irregular shaped transistor device, further including:
identifying a first terminal associated with the first source;
determining one or more current-voltage curves of the first channel of the irregular shaped transistor device in response to a DC voltage applied at the first terminal associated with the first source; and
determining the equivalent resistance of the first channel based on the one or more current-voltage curves of the first channel.

4. The method of claim 1, comprising:
identifying a predetermined equivalent resistance model based on the irregular shape;
determining a set of device characteristics of the irregular shaped transistor device; and
in accordance with the predetermined equivalent resistance model, determining the equivalent resistance of the first channel of the irregular shaped transistor device based on the set of device characteristics.

5. The method of claim 4, wherein the set of device characteristics includes one or more combinations of values of the device characteristics, and the predetermined equivalent resistance model includes a lookup table associating each of the one or more combinations of the values of the device characteristics with a respective equivalent resistance of the first channel.

6. The method of claim 5, wherein the equivalent resistance of the first channel of the irregular shaped transistor device is interpolated from two equivalent resistances in the lookup table.

7. The method of claim 4, wherein the predetermined equivalent resistance model is established using one of a field solver program and a device solver program, and stored in the memory of the computer system, the field solver program being configured to determine the equivalent resistance of the first channel based on analysis of electrical field in the first channel, the device solver program being configured to determine the equivalent resistance of the first channel based on current-voltage behavior of the irregular shaped transistor device.

8. The method of claim 7, further comprising:
determining, in the field solver program, the predetermined equivalent resistance model based on a small signal excitation model, further including:
identifying a plurality of device characteristics for the irregular shaped transistor device;
for each of one or more combinations of values of the plurality of device characteristics:
identifying at least one of a first terminal associated with the first source and a second terminal associated with the first drain;
determining S-parameters of the first channel of the irregular shaped transistor device in response to a small excitation signal at the first terminal associated with the first source;
converting the S-parameters to Z-parameters of the first channel of the irregular shaped transistor device;
determining a respective equivalent resistance of the first channel based on the Z-parameters of the first channel; and
associating, in a lookup table, the respective combination of values of the plurality of device characteristics with the respective equivalent resistance of the first channel.

9. The method of claim 1, wherein the length of the first channel is determined based on locations of the first source and the first drain, and determining the length of the first channel includes averaging a distance between the first source and the first drain along a width of the first channel of the irregular shaped transistor device.

10. The method of claim 1, wherein determining the length of the first channel includes:
    identifying a minimum length and a maximum length along a width of the first channel of the irregular shaped transistor device; and
    averaging the minimum length and the maximum length to determine the length of the first channel.

11. The method of claim 1, wherein determining the length of the first channel includes:
    identifying a middle point along a width of the first channel of the irregular shaped transistor device; and
    determining a channel length at the middle point to represent the length of the first channel.

12. The method of claim 1, wherein:
    one of the first source and the first drain is disposed in a center region of the irregular shape, and the other one of the first source and the first drain is disposed in proximity to a periphery of the irregular shape.

13. A computer system, comprising:
    one or more processors; and
    memory storing one or more programs for execution by the one or more processors, the one or more programs comprising instructions for:
    identifying an irregular shaped transistor device in an integrated circuit computer model, the irregular shaped transistor device having a first active area, a first gate, a first source, a first drain, and a first channel that connects the first source and the first drain, wherein the first channel has an irregular shape defined by design as a non-rectangular area where the first gate overlaps the first active area;
    determining using a solver program an equivalent resistance of the first channel of the irregular shaped transistor device based on the irregular shape of the first channel;
    determining a first length of the first channel;
    determining a first width of the first channel of the irregular shaped transistor device based on the equivalent resistance of the first channel and the first length of the first channel; and
    converting the irregular shaped transistor device to a regular shaped transistor device having a second active area, a second gate, a second source, a second drain, and a second channel defined by a rectangular area in subsequent analysis of the integrated circuit computer model, where the second gate overlaps the second active area, and has a second width and a second length that are equivalent to the first width and the first length of the first channel of the irregular shaped transistor device.

14. The computer system of claim 13, wherein the irregular shape is one of predefined hollow rectangular, hollow hexagonal, hollow octagonal and hollow circular shapes.

15. The computer system of claim 13, wherein the first gate includes an array of openings, and each opening is configured to accommodate a contact for one of the first source and first drain.

16. The computer system of claim 13, wherein the computer system includes a local client device and a server system, and the server system is installed with a circuit simulation program and/or a solver program configured to implement the subsequent analysis of the integrated circuit computer model.

17. A non-transitory computer readable storage medium storing one or more programs configured for execution by one or more processors of a computer system, the one or more programs comprising instructions for:
    identifying an irregular shaped transistor device in an integrated circuit computer model, the irregular shaped transistor device having a first active area, a first gate, a first source, a first drain, and a first channel that connects the first source and the first drain, wherein the first channel has an irregular shape defined by design as a non-rectangular area where the first gate overlaps the first active area;
    determining using a solver program an equivalent resistance of the first channel of the irregular shaped transistor device based on the irregular shape of the first channel;
    determining a first length of the first channel;
    determining a first width of the first channel of the irregular shaped transistor device based on the equivalent resistance of the first channel and the first length of the first channel; and
    converting the irregular shaped transistor device to a regular shaped transistor device having a second active area, a second gate, a second source, a second drain, and a second channel defined by a rectangular area in subsequent analysis of the integrated circuit computer model, where the second gate overlaps the second active area, and has a second width and a second length that are equivalent to the first width and the first length of the first channel of the irregular shaped transistor device.

18. The non-transitory computer readable storage medium of claim 17, the one or more programs further comprising instructions for:
    determining a sheet resistance of the first channel of the irregular shaped transistor device, wherein the first width of the first channel of the irregular shaped transistor device is determined based on the sheet resistance and the length of the first channel.

19. The non-transitory computer readable storage medium of claim 17, wherein the subsequent analysis of the integrated circuit computer model is implemented by a circuit simulation program, and the determination of the equivalent resistance of the first channel of the irregular shaped transistor device involves a solver program that is distinct from the circuit simulation program.

20. The non-transitory computer readable storage medium of claim 19, wherein the circuit simulation program includes a SPICE simulator, and the solver program is configured to solve Maxwell equations related to the first channel of the irregular shaped transistor device.

* * * * *